(12) United States Patent
Tischler et al.

(10) Patent No.: US 10,319,890 B2
(45) Date of Patent: Jun. 11, 2019

(54) SYSTEMS FOR ADHESIVE BONDING OF ELECTRONIC DEVICES

(71) Applicants: Michael A. Tischler, Vancouver (CA); Alborz Amini, Vancouver (CA)

(72) Inventors: Michael A. Tischler, Vancouver (CA); Alborz Amini, Vancouver (CA)

(73) Assignee: COOLEDGE LIGHTING INC., Richmond, British Columbia (CA)

( * ) Notice: Subject to any disclaimer, the term of this patent is extended or adjusted under 35 U.S.C. 154(b) by 454 days.

(21) Appl. No.: 15/006,242

(22) Filed: Jan. 26, 2016

(65) Prior Publication Data

US 2016/0218025 A1  Jul. 28, 2016

Related U.S. Application Data

(60) Provisional application No. 62/107,660, filed on Jan. 26, 2015, provisional application No. 62/198,415, filed on Jul. 29, 2015.

(51) Int. Cl.
*H01L 21/67* (2006.01)
*H01L 33/62* (2010.01)
*H01L 23/00* (2006.01)

(52) U.S. Cl.
CPC .............. *H01L 33/62* (2013.01); *H01L 24/75* (2013.01); *H01L 2224/16225* (2013.01); *H01L 2224/32225* (2013.01); *H01L 2224/73204* (2013.01); *H01L 2224/7598* (2013.01); *H01L 2224/75101* (2013.01); *H01L 2224/83851* (2013.01); *H01L 2924/07811* (2013.01); *H01L 2924/07812* (2013.01); *H01L 2924/181* (2013.01); *H01L 2933/0066* (2013.01)

(58) Field of Classification Search
CPC ................................ H01L 33/62; H01L 24/75
See application file for complete search history.

(56) References Cited

U.S. PATENT DOCUMENTS

| | | | | |
|---|---|---|---|---|
| 4,933,042 A | * | 6/1990 | Eichelberger | H01L 21/56 156/239 |
| 5,123,985 A | * | 6/1992 | Evans | B29D 7/01 156/212 |
| 5,605,547 A | * | 2/1997 | Lake | H01L 21/568 257/E21.511 |

(Continued)

FOREIGN PATENT DOCUMENTS

JP  2001237277 A  8/2001

OTHER PUBLICATIONS

International Search Report and Written Opinion issued in a corresponding International Application No. PCT/US2016/014852 dated May 31, 2016.

*Primary Examiner* — Daniel McNally
(74) *Attorney, Agent, or Firm* — Morgan, Lewis & Bockius LLP

(57) ABSTRACT

In accordance with certain embodiments, an apparatus for bonding electronic components such as light-emitting elements each to a connection point on a substrate via an adhesive includes a platform for supporting the substrate, a membrane for covering the electronic components, a source of pressure for urging the membrane against the electronic components, whereby pressure is applied between each electronic component and its corresponding connection point, and a source of energy for at least partially curing the adhesive.

25 Claims, 11 Drawing Sheets

(56) References Cited

U.S. PATENT DOCUMENTS

| | | | | |
|---|---|---|---|---|
| 5,681,757 A | * | 10/1997 | Hayes | H01L 21/563 |
| | | | | 156/295 |
| 5,866,442 A | * | 2/1999 | Brand | H01L 21/563 |
| | | | | 438/108 |
| 6,203,639 B1 | * | 3/2001 | Swanson | C09J 5/06 |
| | | | | 156/108 |
| 6,315,856 B1 | * | 11/2001 | Asagiri | H05K 3/321 |
| | | | | 156/277 |
| 6,492,194 B1 | * | 12/2002 | Bureau | H01L 21/56 |
| | | | | 257/E21.502 |
| 2005/0178490 A1 | * | 8/2005 | McGlinchy | E06B 3/67339 |
| | | | | 156/64 |
| 2006/0092614 A1 | | 5/2006 | Partridge et al. | |
| 2008/0310938 A1 | * | 12/2008 | Inoue | H01L 21/67132 |
| | | | | 414/151 |
| 2009/0291524 A1 | * | 11/2009 | Takahashi | H01L 21/56 |
| | | | | 438/108 |

* cited by examiner

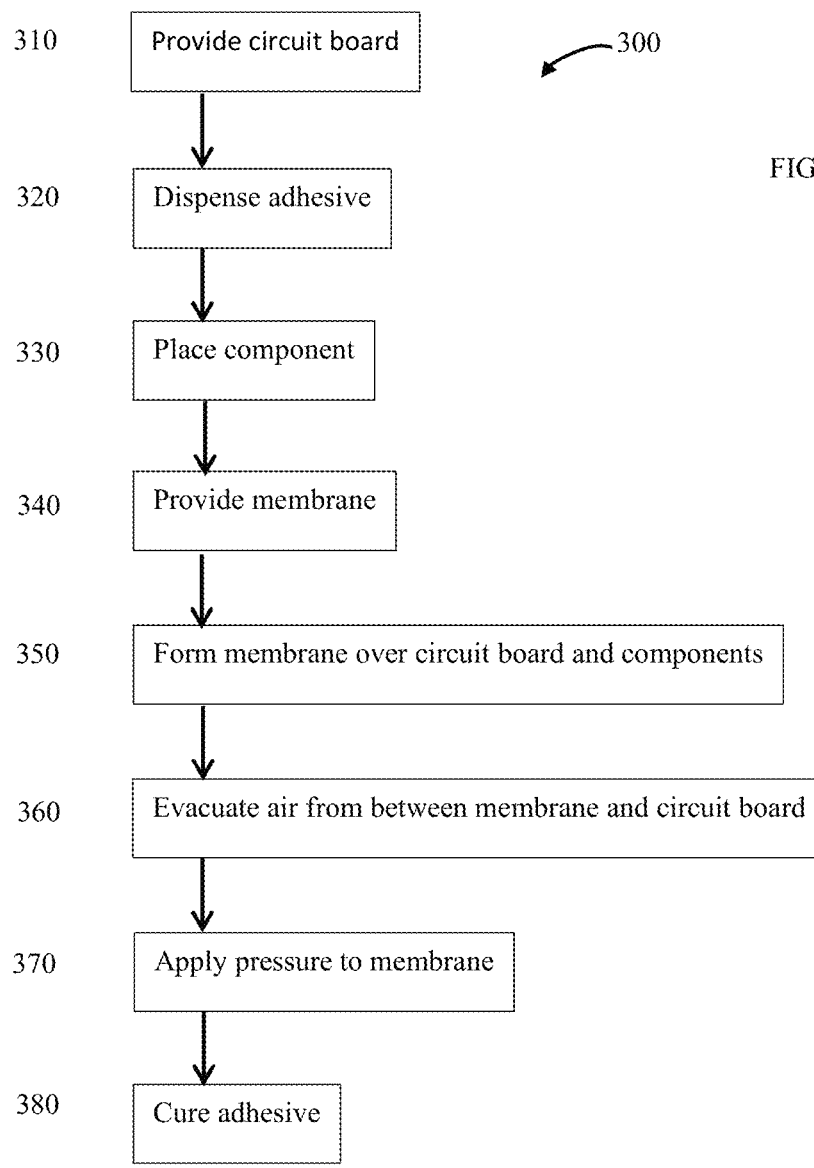

SYSTEMS FOR ADHESIVE BONDING OF ELECTRONIC DEVICES

RELATED APPLICATIONS

This application claims the benefit of and priority to U.S. Provisional Patent Application No. 62/107,660, filed Jan. 26, 2015, and U.S. Provisional Patent Application No. 62/198,415, filed Jul. 29, 2015, the entire disclosure of each of which is hereby incorporated herein by reference.

FIELD OF THE INVENTION

In various embodiments, the present invention generally relates to electronic device mounting, and more specifically to the mounting of electronic devices via pressure-activated adhesives.

BACKGROUND

A number of attachment methods may be utilized to attach and electrically connect a semiconductor die to a package or directly to a substrate or to attach a packaged semiconductor device to a substrate or printed circuit board. Several common methods include wire bonding, solder, adhesive, conductive adhesive, and anisotropic conductive adhesive (ACA). An ACA is a material that enables electrical coupling in one direction (e.g., vertically between a device contact and a substrate contact), but prevents it in other directions (e.g., horizontally between contacts on a device or between contracts on a substrate). ACA may be utilized in various forms, for example a paste, gel, liquid, or film.

There are several approaches to packaging of semiconductor dies. These include mounting the die on a lead frame, either with contacts on the semiconductor die facing up (where the contact pads on the die are typically electrically coupled to the package contacts through wire bonds), or in a flip-chip configuration, in which the contacts on the semiconductor die are facing down and may be electrically coupled to the package contacts more or less directly, for example using solder, conductive adhesive, or ACA. Wire bonding is typically more expensive than flip-chip mounting, and in some configurations may introduce a higher thermal resistance than the flip-chip configuration.

Packages are typically mounted to a substrate or circuit board using solder, for example using a reflow solder process. Semiconductor dies may be directly attached to a substrate or circuit board, without a traditional package, for example using solder or conductive adhesive or ACA. In particular, ACA has been widely used in the attachment of chips to RFID substrates, and has recently been developed for use with LEDs, as detailed in U.S. patent application Ser. No. 13/171,973, filed on Jun. 29, 2011 (the '973 application), U.S. patent application Ser. No. 13/784,417, filed on Mar. 4, 2013, and U.S. patent application Ser. No. 13/949,546, filed on Jul. 24, 2013, the entire disclosure of each of which is incorporated herein by reference.

ACAs have a number of potential advantages over solder, including the ability to use aluminum rather than copper traces, which may result in reduced cost and the ability to manufacture using a roll-to-roll configuration. High-volume tools for RFID manufacture using ACA are commercially available, for example from Muhlbauer in Roding, Germany.

As known in the art, an ACA typically features an adhesive matrix, e.g., an adhesive or epoxy material, containing "particles" (e.g., spheres or particles with other shapes) of a conductive material or of an insulating material coated with a conductive material (such as metal). FIG. 1A depicts a typical schematic of the connection of an electronic device to a substrate via ACA. As shown, an electronic device 105 having multiple contacts 110 has been adhered and electrically connected to conductive traces 160 disposed over a substrate 120 of a circuit board 165 (circuit board 165 includes substrate 120 and conductive traces 160; in some embodiments circuit board 165 may also include one or more components 105 and other elements) via an ACA 130. ACA 130 is typically composed of an adhesive matrix 140 containing a dispersion of particles 150 that are at least partially conductive. In some configurations, the use of ACA may require the use of stud bumps 170; however, these may not be required, for example as shown in FIG. 1B and described in the '973 application. It should be noted that other techniques involving ACAs are possible, and the present invention is not limited by the particular mode of operation of the ACA.

Most ACAs are pressure-activated, and thus require application of pressure and temperature to cure the ACA, forming a permanent electrical and/or mechanical connection. The temperature and pressure are typically applied using a thermode, which provides a means to apply a force and heat to a desired temperature. In high-volume manufacture, multiple thermodes are activated simultaneously over a portion of the substrate, curing multiple electronic devices simultaneously. FIG. 1C shows a schematic of a thermode configuration that includes bottom and top thermodes 181 and 182 respectively. The thermodes typically apply pressure and heat to device 183 directly in the case of thermode 182 and through substrate 180 (substrate 180 may also include conductive traces and other elements, not shown for clarity in FIG. 1C, that may affect or hinder the flow of heat to the ACA) in the case of thermode 181. One issue with this approach is that the thermode field must be reconfigured for each new design—that is, the thermodes must be re-positioned to correspond to the positions of the devices on the substrate. This change-over may be relatively time-consuming and expensive. A second issue is that there is typically a one-to-one correspondence between the number of devices and the number of thermodes required in a given area, i.e., there typically needs to be one thermode for each device within the thermode field area. For systems having very high component counts, this means the curing system must have a very large number of thermodes, which increases cost and configuration time.

A third issue with this approach is that the thermodes have a minimum spacing, determined by the actual thermode size and wiring to the thermodes, which may be larger than the desired spacing between devices on the substrate. This may make it impossible to cure both devices 183 and 185 (see FIG. 1C) simultaneously, because their spacing is less than the minimum thermode spacing. This size limitation may currently be addressed in two ways. The first is to use multiple cure steps, for example curing every other device, to accommodate the thermode size limitations. This is very costly, as it requires repeating the process at least twice, and may also result in damage to the devices and/or substrate during subsequent cure steps. This is particularly onerous for roll-to-roll manufacture, in which the web would have to be run through the tool more than once. A second challenge with this approach is the possibility of pre-curing the ACA in devices adjacent to those being cured. An example of this would be the ACA for device 185 being partially or fully cured without the application of pressure from a thermode, by heat flow through substrate 180 (including the conductive traces not shown in FIG. 1C) from the adjacent thermodes. A second approach is to use a custom thermode system, with fixed position pins that contact each device. Such systems can have a smaller spacing, but require a custom, fixed thermode field for each design, which is expensive and takes a relatively significant time to procure.

In view of the foregoing, a need exists for systems and procedures enabling the low cost reliable curing of pressure-activated adhesives (such as ACAs) for various electronic devices, for example packaged devices and semiconductor dies, directly to the electrical traces of a package or to electrical traces on a substrate without the size and through-put limitations of conventional curing systems.

SUMMARY

In accordance with certain embodiments, one or more semiconductor bare-die devices and/or packaged devices such as light-emitting elements are attached to a substrate with a pressure-sensitive adhesive (e.g., a conductive adhesive or an ACA). The adhesive is activated for all devices substantially simultaneously via fluid pressure applied to a flexible membrane positioned over the devices. The adhesive may be cured during and/or after application of the fluid pressure via application of, e.g., heat.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux LEDs, laser diodes or other similar devices as would be readily understood. The emitted radiation of an LEE may be visible, such as red, blue or green, or invisible, such as infrared or ultraviolet. An LEE may produce radiation of a continuous or discontinuous spread of wavelengths. An LEE may feature a phosphorescent or fluorescent material, also known as a light-conversion material, for converting a portion of its emissions from one set of wavelengths to another. In some embodiments, the light from an LEE includes or consists essentially of a combination of light directly emitted by the LEE and light emitted by an adjacent or surrounding light-conversion material. An LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective. Herein the term "reflective" is defined as having a reflectivity greater than 65% for a wavelength of light emitted by the LEE on which the contacts are disposed unless otherwise defined. In some embodiments, an LEE may include or consist essentially of an electronic device or circuit or a passive device or circuit. In some embodiments, an LEE includes or consists essentially of multiple devices, for example an LED and a Zener diode for static-electricity protection. In some embodiments, an LEE may include or consist essentially of a packaged LED, i.e., a bare LED die encased or partially encased in a package. In some embodiments, the packaged LED may also include a light-conversion material. In some embodiments, the light from the LEE may include or consist essentially of light emitted only by the light-conversion material, while in other embodiments the light from the LEE may include or consist essentially of a combination of light emitted from an LED and from the light-conversion material. In some embodiments, the light from the LEE may include or consist essentially of light emitted only by an LED.

In one embodiment, an LEE includes or consists essentially of a bare semiconductor die, while in other embodiments an LEE includes or consists essentially of a packaged LED. In some embodiments, LEE may include or consist essentially of a "white die" that includes an LED that is integrated with a light-conversion material (e.g., a phosphor) before being attached to the light sheet, as described in U.S. patent application Ser. No. 13/748,864, filed Jan. 24, 2013, or U.S. patent application Ser. No. 13/949,543, filed Jul. 24, 2013, the entire disclosure of each of which is incorporated by reference herein.

In an aspect, embodiments of the invention feature an apparatus for bonding a plurality of electronic components each to a connection point on a substrate via an adhesive. The apparatus includes or consists essentially of a platform for supporting the substrate, a membrane for covering the plurality of electronic components, a source of pressure for urging the membrane against the plurality of electronic components, whereby pressure is applied between each electronic component and its corresponding connection point, and a source of energy for at least partially curing the adhesive.

Embodiments of the invention may include one or more of the following in any of a variety of combinations. One or more portions, or even all, of the platform may be substantially rigid. The source of pressure may include, consist essentially of, or consist of a source of fluid pressure. The membrane may include, consist essentially of, or consist of a flexible membrane. The source of pressure may include, consist essentially of, or consist of a vacuum pump for inducing a negative pressure between the membrane and the substrate. The source of pressure may include, consist essentially of, or consist of a source of liquid or a source of gas. The source of energy may include, consist essentially of, or consist of a plurality of energy sources. The amount of energy emitted by each energy source may be individually controllable. At least one of the energy sources may include, consist essentially of, or consist of a heat source. The source of energy may include, consist essentially of, or consist of a plurality of heat sources disposed at least partially within and/or on the platform and/or the flexible membrane.

The source of energy may include, consist essentially of, or consist of a heat source. The source of energy may include, consist essentially of, or consist of an array of individually addressable heating elements. The source of pressure and/or the source of energy may be, in whole or in part, an autoclave chamber for receiving therewithin the substrate, the platform, and the membrane. The source of energy may be disposed at least partially within and/or on the platform. The platform may be substantially rigid in the sense that it resists deformation when pressure is applied by the source of pressure. The source of energy may be disposed at least partially within and/or on the membrane. The source of energy may include, consist essentially of, or consist of an ultraviolet light source. At least one of the electronic components may include, consist essentially of, or consist of a light-emitting element. At least one of the electronic components may include, consist essentially of, or consist of a light-emitting diode. The adhesive may include, consist essentially of, or consist of an anisotropic conductive adhesive and/or an isotropic conductive adhesive.

The apparatus may include a supply roll for supplying at least a portion of the substrate to the platform and/or a take-up roll for receiving the at least a portion of the substrate from the platform. The substrate may be flexible and may be a web extending from the supply roll to the take-up roll. The apparatus may include an adhesive dispense station for dispensing adhesive over the substrate, a component placement station for placing the plurality of electronic components over the substrate, and/or a test station for electronically and/or optically testing at least some of the electronic components. The adhesive dispense station may include or consist essentially of a reservoir for containing one or more adhesives. The reservoir may contain one or more adhesives disposed therewithin. The adhesive(s) may include, consist essentially of, or consist of an anisotropic conductive adhesive and/or an isotropic conductive adhesive.

In another aspect, embodiments of the invention feature a method of fabricating an electronic device. The electronic device includes or consists essentially of a plurality of electronic components each bonded to a connection point on a substrate. Each of the plurality of electronic components is positioned over a different connection point on the substrate. A pressure-activated adhesive is provided between each electronic component and its connection point (i.e., the connection point over which the electronic component is positioned). A membrane is provided over the plurality of electronic components and the substrate. A pressure is applied, via the membrane, simultaneously or substantially simultaneously between each electronic component and its connection point. The pressure-activated adhesive is cured, thereby bonding each electronic component to its connection point.

Embodiments of the invention may include one or more of the following in any of a variety of combinations. Applying the pressure via the membrane may include, consist essentially of, or consist of application of a fluid pressure to the membrane. A region between the membrane and the substrate and/or the plurality of electronic components may be at least partially evacuated (e.g., at least partially emptied of a fluid such as a gas or a liquid). A pressure in a region between the membrane and the substrate may be reduced. The fluid pressure may be at least partially applied to a surface of the membrane opposite the plurality of electronic components by a gas and/or by a liquid. The fluid pressure may be at least partially applied by generating at least a partial vacuum in a region between the membrane and the substrate and/or the plurality of electronic components. The fluid pressure may be at least partially applied by generating a negative pressure between the membrane and the substrate and/or the plurality of electronic components. The value of the negative pressure may be smaller than the value of a pressure on a surface of the membrane opposite the plurality of electronic components.

Applying the pressure via the membrane may include, consist essentially of, or consist of at least partially evacuating (i.e., evacuating at least some of a fluid from) a region between the membrane and the plurality of electronic components. The membrane may include, consist essentially of, or consist of a flexible membrane. At least a portion of the membrane may be flexible. Curing the pressure-activated adhesive may include, consist essentially of, or consist of applying heat thereto. At least one connection point may include, consist essentially of, or consist of two conductive traces defining a gap therebetween. At least one electronic component may include two spaced-apart contacts to each be bonded to one of the conductive traces. The pressure-activated adhesive may include, consist essentially of, or consist of an anisotropic conductive adhesive and/or an isotropic conductive adhesive. At least two of the electronic components may have different sizes and/or heights. The electronic components may be positioned over the substrate such that a first pair of electronic components are separated by a first spacing and a second pair of electronic components are separated by a second spacing different from the first spacing. The pressure-activated adhesive may be cured after and/or during application of the pressure.

At least one of the electronic components may include, consist essentially of, or consist of a bare-die light-emitting element. At least one of the electronic components may include, consist essentially of, or consist of a packaged light-emitting element (i.e., containing a bare-die light-emitting element and one or more other packaging elements such as a leadframe, lens, etc.). At least one of the electronic components may include, consist essentially of, or consist of a light-emitting diode. At least one of the electronic components may be unpackaged. At least one of the electronic components may be packaged. The substrate may include, consist essentially of, or consist of a flexible web extending from a supply roll (or supply reel) and/or extending to a take-up roll (or take-up reel). Providing the pressure-cured adhesive may include, consist essentially of, or consist of disposing the pressure-cured adhesive over at least a portion of at least one of the connection points. Providing the pressure-cured adhesive may include, consist essentially of, or consist of disposing the pressure-cured adhesive over at least a portion of at least one of the electronic components. The substrate may include thereon a plurality of conductive traces. At least one connection point may include, consist essentially of, or consist of at least a portion of a conductive trace. At least one of the conductive traces may include, consist essentially of, or consist of copper, aluminum, carbon, conductive fibers, gold, silver, one or more transparent conductive materials, and/or one or more conductive inks. substrate may include, consist essentially of, or consist of polyethylene naphthalate, polyethylene terephthalate, polycarbonate, polyethersulfone, polyester, polyimide, polyethylene, plastic, glass, metal, fabric, cloth, fiberglass, FR4, FR2, and/or paper.

The membrane may be pliant. When pressure is applied via the membrane, the membrane may substantially conform to the shapes of the underlying electronic components. A force multiplier may be disposed between at least one electronic component and the membrane. The force multiplier may include, consist essentially of, or consist of plastic, glass, metal, and/or paper. The force multiplier may include, consist essentially of, or consist of one or more materials that are less pliant and/or less flexible than the membrane. When pressure is applied via the membrane, the membrane may conform only partially to the shapes of the underlying electronic components. A protective layer may be disposed between at least one electronic component and the membrane. After curing the pressure-activated adhesive, the protective layer may cover or be disposed over at least one electronic component and may be adhered to at least a portion of the substrate. After curing the pressure-activated adhesive, the protective layer may be in contact with or spaced apart from at least one electronic component.

A shaped protective layer may be disposed between at least one electronic component and the membrane. After curing the pressure-activated adhesive, the shaped protective layer may cover or be disposed over the at least one electronic component and may be bonded (e.g., adhered) to at least a portion of the substrate. The shaped protective layer may include a curved portion that is disposed over the at least one electronic component. After curing the pressure-activated adhesive, the shaped protective layer may be in contact with or spaced apart from at least one electronic component. A second adhesive may be disposed between at least a portion of the shaped protective layer and at least a portion of the substrate. The second adhesive may be pressure-activated. A second protective layer may be disposed between at least one electronic component and the membrane. After curing the pressure-activated adhesive, the second protective layer may bond (e.g., adhere) the shaped protective layer to the substrate. The second protective layer may be disposed between the shaped protective layer and the substrate. The second protective layer may be disposed between the shaped protective layer and the membrane. The second protective layer may cover or be disposed over the at least one electronic component. The second protective layer may not cover or may not be disposed over the at least one electronic component. The second protective layer may not conformally cover the at least one electronic component. After curing the pressure-activated adhesive, the shaped protective layer may not be optically coupled to the at least one electronic component. The shaped protective layer may defines a plurality of recesses (e.g., bumps). Each recess may be disposed over one or more electronic components. The curved portion of the shaped protective layer may include, consist essentially of, or consist of an optic (e.g., be shaped as or define an optic). The optic may include, consist essentially of, or consist of a reflecting optic, a refracting optic, a total internal reflection optic, and/or a Fresnel optic. The shaped protective layer may include, consist essentially of, or consist of a plurality of curved portions. Each curved portion may be disposed over one or more electronic components. Each curved portion of the shaped protective layer may include, consist essentially of, or consist of an optic (e.g., be shaped as or define an optic). Each optic may include, consist essentially of, or consist of a reflecting optic, a refracting optic, a total internal reflection optic, and/or a Fresnel optic. The shaped protective layer may include one or more portions (e.g. straight and/or flat and/or uncurved portions) connecting the plurality of curved portions. At least two (e.g., all) of the curved portions may be discrete segments that are not connected to each other (i.e., the shaped protective layer may include, consist essentially of, or consist of a plurality of discrete, unconnected segments).

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the terms "about," "approximately," and "substantially" mean±10%, and in some embodiments, ±5%. The term "consists essentially of" means excluding other materials that contribute to function, unless otherwise defined herein. Nonetheless, such other materials may be present, collectively or individually, in trace amounts.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other. Substrates, light sheets, components, and/or portions thereof described as "reflective" may be specularly reflective or diffusively reflective unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 3 is a flow chart of a process for curing pressure-activated adhesive in accordance with various embodiments of the invention;

DETAILED DESCRIPTION

Figure 2A:
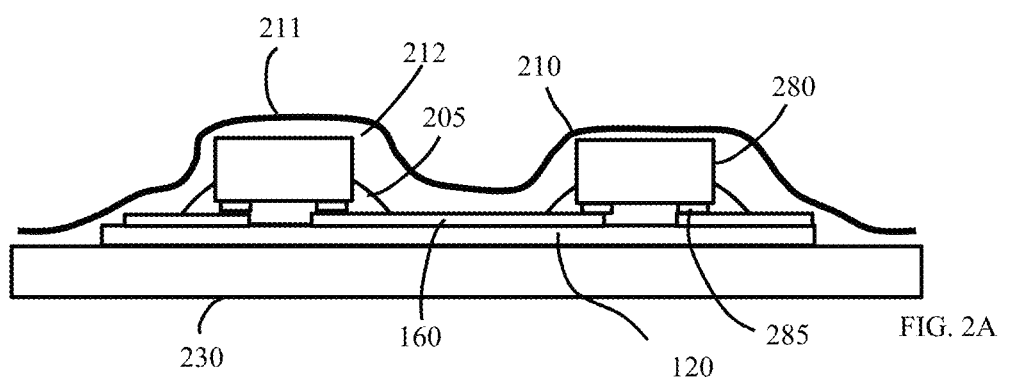
FIGS. 2A-2C are schematic illustrations of curing systems in accordance with various embodiments of the invention.

FIG. 2A is a schematic showing an adhesive curing apparatus in accordance with embodiments of the present invention. In curing processes in accordance with embodiments of the invention, the components or assembly or circuit board to be cured are positioned between a membrane 210 and a base 230. Herein, the term "circuit board" is utilized to represent any platform or substrate to which devices or components are meant to be attached. A circuit board may, but does not necessarily, have a network of traces or other electrical connections that interconnect such devices into one or more electrical circuits. In various embodiments of the present invention, the basic process may proceed as follows. An adhesive 205 is dispensed, components 280 are placed, flexible membrane 210 is placed over the assembly to be cured, pressure is applied to the components 280 via membrane 210, and heat is applied to cure the adhesive. The adhesive 205 may include or consist essentially of, e.g., an ACA or another conductive adhesive (e.g., an isotropically conductive adhesive).

FIG. 2A shows a component 280 having electrical contacts 285, as well as adhesive 205 disposed between the component 280 and conductive traces 160 that are disposed on substrate 120. The assembly or item to be cured, here including components 280, adhesive 205, conductive traces 160, and substrate 120, is placed between membrane 210 and base 230. In various embodiments of the present invention, during the curing process, pressure and heat are applied to adhesive 205. Pressure is applied to adhesive 205 by membrane 210 applying pressure to components 280, as will be discussed herein, while heat may be applied using a variety of means, as will be discussed herein, and other elements of the apparatus or assembly may be heated as well during this process. In various embodiments of the present invention, pressure and heat may be applied simultaneously, while in other embodiments the timings of the application of heat and pressure may be different.

In various embodiments of the present invention, pressure may be applied to the components by various means, e.g., application of a fluid or gas pressure to the exterior side of membrane 210 (i.e., the side of membrane 210 that is opposite the side adjacent to component 280), which is identified as region 211 in FIG. 2A. In various embodiments, pressure may be applied to the components by evacuating or partially evacuating a region 212 between membrane 210 and the components, for example by pumping the air (or gas or fluid) out of region 212 or partially pumping the air (or gas or fluid) out of region 212. In various embodiments, this forms a reduced (i.e., negative) pressure in region 212 compared to region 211, thereby applying pressure to the components via membrane 210. In various embodiments, pressure may be applied to the exterior side of membrane 210 (region 211) and region 212 may be evacuated or partially evacuated. In various embodiments, pressure may be applied to the exterior side of membrane 210 (region 211) without evacuating or partially evacuating region 212. In such cases, in various embodiments, pressure applied to region 211 may force all or substantially all of the air or fluid from region 212. However, these methods of applying pressure are not a limitation of the present invention, and in other embodiments pressure may be applied in other ways, for example by pulling or stretching the membrane against the components. In various embodiments of the present invention, the pressure that is applied to components 280 is transferred or substantially transferred to adhesive 205, and not substantially dissipated in other portions of the assembly and/or apparatus. In various embodiments of the present invention, base 230 is rigid or substantially rigid, such that pressure applied to components 280 is transferred or substantially transferred to adhesive 205 and is not dissipated or transferred to other portions of the apparatus. In various embodiments, base 230 is not deformed or substantially deformed during the curing process.

Figure 2B:
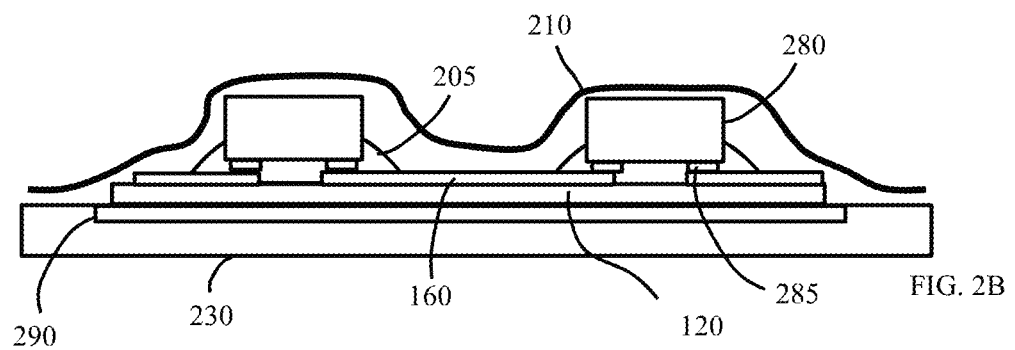

FIG. 2B is a schematic showing an adhesive curing apparatus in accordance with embodiments of the present invention. The apparatus of FIG. 2B is similar to that described in reference to FIG. 2A; however, the apparatus of FIG. 2B incorporates one or more heaters 290 for applying heat to adhesive 205. In various embodiments of the present invention, heater(s) 290 may be incorporated in or on base 230 or may be disposed on base 230. In various embodiments, base 230 or heater 290 or other elements of the apparatus may include a system for improving thermal contact between the circuit board and the heater, for example a clamping mechanism to hold the circuit board in contact with the heater and/or a thermal paste or other thermal conductor to facilitate thermal conductivity between the heater 290 and the circuit board. In various embodiments, the circuit board may be held in contact with the heater using a vacuum plate, for example including one or more vacuum holes or ports or a porous vacuum plate or chuck.

Figure 1A:
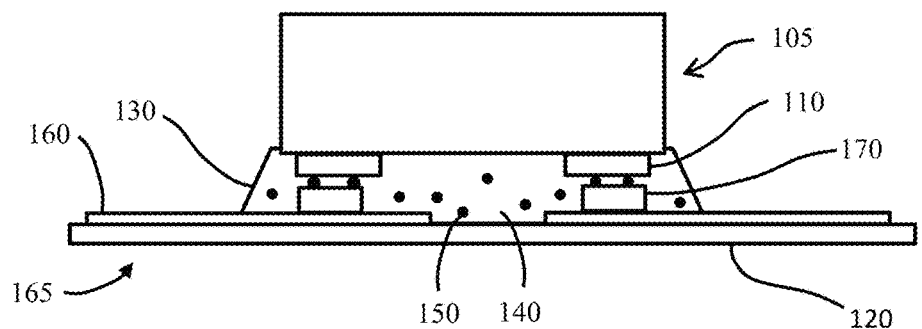
FIG. 1A is a schematic illustration of a semiconductor die bonded to stud bumps on a substrate via a pressure-activated adhesive.
Figure 1B:
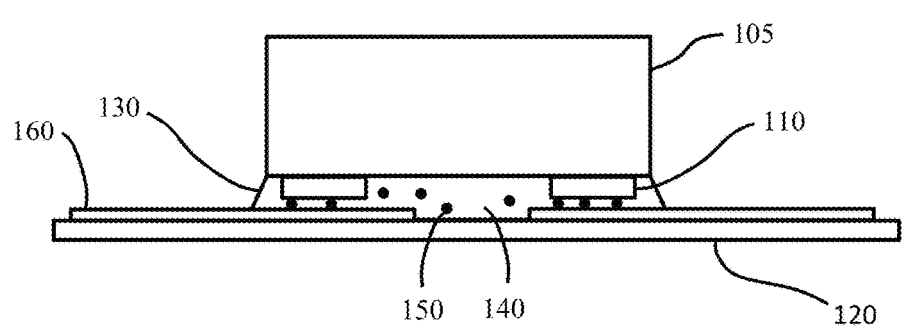
FIG. 1B is a schematic illustration of a semiconductor die bonded without stud bumps on a substrate via a pressure-activated adhesive.
Figure 1C:
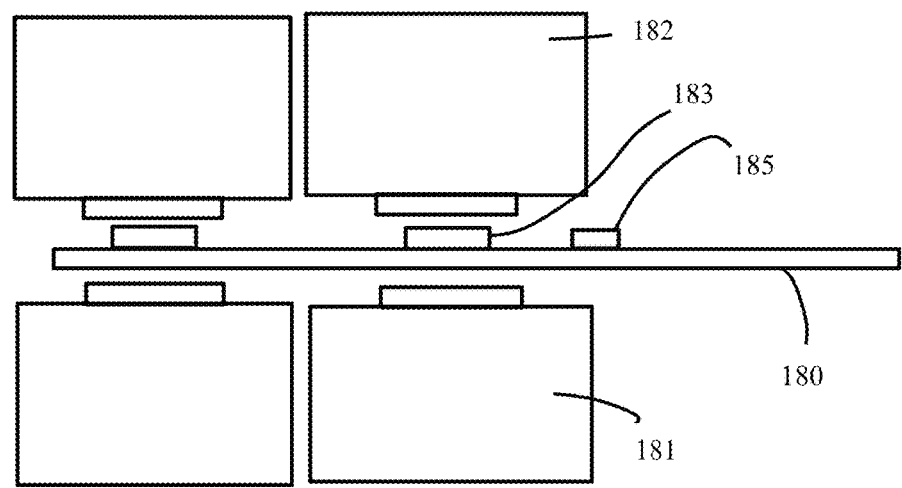
FIG. 1C is a schematic illustration of a thermode system for curing a pressure-activated adhesive.

Various embodiments of the invention beneficially use the membrane 210 to apply pressure to components 280 during the adhesive curing process. By evacuating the air under membrane 210 and/or increasing the gas or fluid pressure above membrane 210, membrane 210 is pressed against components 280, applying force to each component. The pressurized membrane replaces the thermodes of the conventional approach discussed in reference to FIG. 1C. The membrane-pressure cure approach of embodiments of the present invention has a number of significant advantages over conventional approaches. First, pressure is applied uniformly to all components on the circuit board, independent of the size of the circuit board and number of components. Second, the pressure that is applied to each component is determined by the gas, fluid or air pressure above the membrane and/or the vacuum or pressure level under membrane 210 (in region 212).

In various embodiments, this may simplify setting the pressure for curing, as the pressure experienced by all of the components beneath the membrane is determined by the gas, fluid, or air pressure above the membrane and/or the vacuum or pressure level under the membrane. In contrast, in traditional approaches each thermode typically must be individually calibrated. In conventional systems, one thermode is used for each component; thus, embodiments of the present invention may permit a large reduction in the number of components of the curing system as well as a simplification of the curing equipment, for example elimination of all of the individual thermodes as well as the control and monitoring wiring (electrical and pneumatic) and equipment that is connected to each thermode. Finally, in various embodiments, the present invention may enable an overall reduction in the number of calibrations and settings required for a cure process.

Third, the flexible membrane may easily conform to a wide range of components having different sizes, heights, and/or positions. This is particularly important because it permits one system to be used for a wide range of circuit boards without the need to reconfigure a thermode field to accommodate different component heights, different component sizes, and/or different component positions and/or spacings. For example, in conventional thermode systems, each time there is any change in a component position, for example a new layout or a different circuit board, the thermode configuration must be changed, which for large arrays of thermodes, for example arrays numbering in the range of 20-100, can take significant time. In various embodiments of the present invention, different layouts or designs may be cured without any reconfiguration of the curing apparatus.

Fourth, membrane 210 may have a relatively high level of flexibility, permitting it to conform to small components and/or components having relatively small inter-component spacing, eliminating the cost and lead time to manufacture a custom thermode, such as a custom pin thermode, and permitting embodiments of the present invention to work with a variety of circuit boards, component heights, sizes, thicknesses, and/or spacings without the need to reconfigure the system between different samples.

Fifth, by curing all the components at the same time, the curing system of embodiments of the present invention may eliminate pre-curing (i.e., unintentional curing or partial curing) of the adhesive before curing is desired, and embodiments of the invention may minimize the required processing time and increase throughput because all components are cured simultaneously (in comparison with conventional thermode curing in which multiple sequential cure steps may be required to cure a dense field of components). These advantages result in a significant reduction in cost as well as a significant reduction in set-up time between different designs.

Figure 2C:
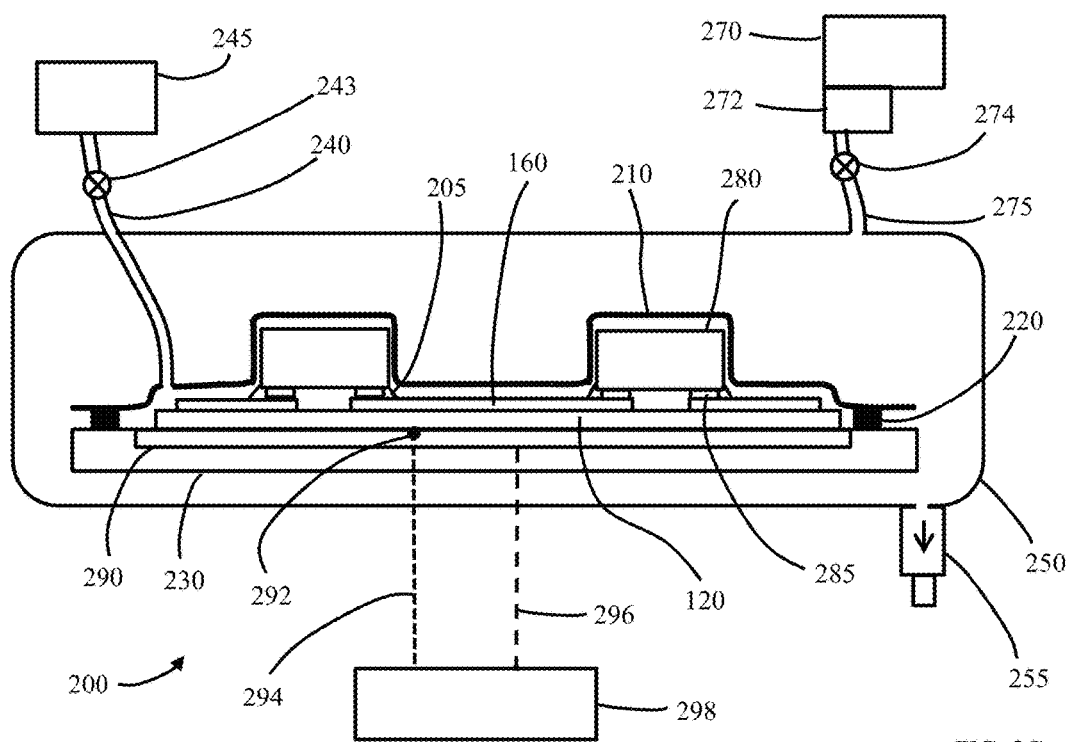

FIG. 2C depicts a more detailed exemplary apparatus 200 for use in various embodiments of the present invention; however, other apparatuses may be utilized within the scope of the invention. As also shown in FIG. 2A, substrate 120 with conductive traces 160 is placed on base 230. In the apparatus of FIG. 2C, heater 290 is incorporated into base 230; however, this is not a limitation of the present invention, and in other embodiments other methods and/or systems may be used to provide heat. In various embodiments, membrane 210 may be optionally sealed to base 230 by a seal 220. In various embodiments, air may be evacuated from the area under membrane 210 using a vacuum source 245 through a valve 243 and a vacuum hose 240. In various embodiments, pressure may be applied to the interior of chamber 250 (thereby applying pressure to membrane 210, which imparts pressure to components 280) by a pressure source 270 through an optional pressure regulator 272, a valve 274, and a pressure hose 275. The temperature of heater 290 may be monitored by one or more temperature sensors 292 that may be connected to a heater controller 298 by a temperature sensor connection 294. Power to heater 290 may be applied from heater controller 298 by a heater connection 296. While FIG. 2C shows one temperature sensor 292, this is not a limitation of the present invention, and in other embodiments multiple temperature sensors 292 may be utilized. While FIG. 2C shows temperature sensor 292 mounted between heater 290 and substrate 120, this s not a limitation of the present invention, and in other embodiments the temperature may be measured in different locations, for example on one or more conductive traces 160, under component 280, and/or within ACA 205. An optional over-pressure release system 255 (e.g., one or more valves configured to open at a particular threshold pressure inside chamber 250) may be incorporated to prevent accidental over-pressurization of chamber 250 and concomitant damage to the apparatus and/or to the components being cured.

FIG. 3 depicts a flowchart of an exemplary process 300 in accordance with various embodiments of the invention. Process 300 is shown having eight steps; however, this is not a limitation of the present invention, and in other embodiments the invention has more or fewer steps and/or the steps may be performed in different order. In step 310, a circuit board is provided. In various embodiments, the circuit board may be rigid or flexible and in various embodiments may include or consist essentially of substrate 120 with conductive traces 160, as shown in FIG. 2A. In step 320, an adhesive is provided or dispensed over the substrate and/or the components to be attached to the substrate. In step 330, the components, chips, or devices are placed on the substrate. In step 340, a membrane is provided. In step 350, the membrane is positioned over the substrate and components. In step 360, air is evacuated from between the membrane and substrate. In step 370, pressure, for example gas or fluid pressure, is applied to the membrane. In step 380, which may take place substantially concurrently (or overlapping in time) with steps 360 and/or 370, the adhesive is cured. In various embodiments of the present invention, pressure is applied to the adhesive in steps 360 and 370. In various embodiments of the present invention, either step 360 may be performed without step 370, or step 370 may be performed without step 360, or pressure may be applied by other means. In various embodiments heat may be applied in steps 360 and/or 370.

Figure 4A:
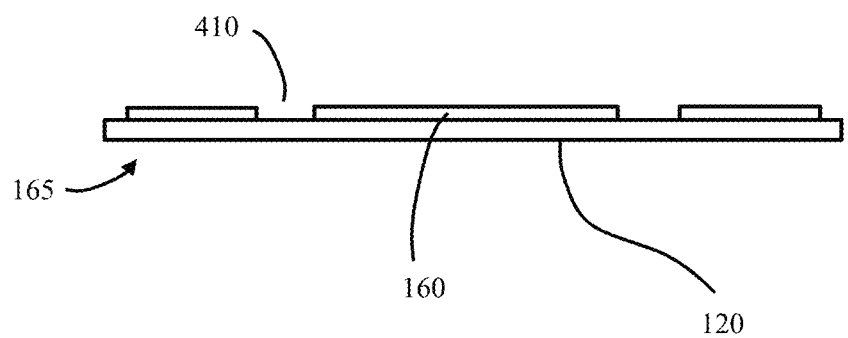
FIGS. 4A-4E are schematic illustrations of various steps utilized to cure pressure-activated adhesives in accordance with various embodiments of the invention.

FIGS. 4A-4E depict one embodiment of process 300 of FIG. 3. In the depicted embodiment, a circuit board 165 is provided according to step 310 of process 300 as shown in FIG. 4A. In various embodiments of the present invention, circuit board 165 includes or consists essentially of a base or substrate 120 over and/or in which are disposed multiple conductive elements 160. In various embodiments of the present invention, circuit board 165 is flexible, while in other embodiments circuit board 165 may be rigid or semi-rigid. The rigidity of circuit board 165 is not a limitation of the present invention. In various embodiments of the present invention, substrate 120 may include, consist essentially of, or consist of one or more of the following: fiberglass, FR4, FR2, acrylic, cloth, polyester, polyimide, polyethylene, polyethersulfone, polyethylene napthalate (PEN), polyetherimide (PEI), polyethylene terephthalate, aluminum, metal, metal core printed circuit board, (MCPCB), fabric, paper, or glass. In various embodiments of the present invention, conductive elements 160 may include, consist essentially of, or consist of one or more of the following: copper, aluminum, carbon, conductive fibers, gold, silver, transparent conductive materials (e.g., transparent conductive oxides such as indium tin oxide), conductive nanocomposites, or conductive ink. The materials of substrate 120 and conductive elements 160 are not limitations of the present invention. In various embodiments of the present invention, as shown in FIG. 4A, conductive elements 160 may be separated by a gap 410.

Figure 4B:
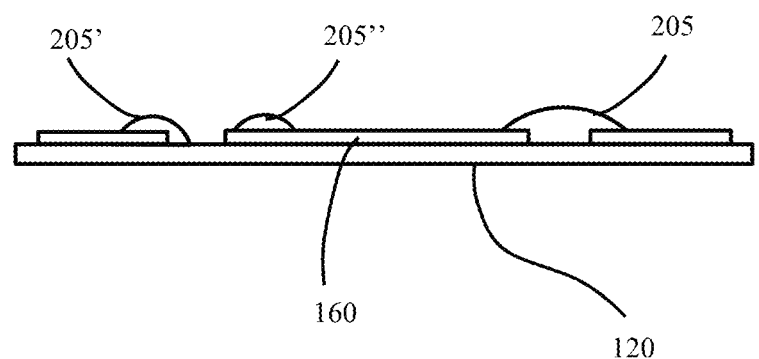

In step 320 of process 300, the adhesive is provided and formed or dispensed in the appropriate locations on the circuit board. FIG. 4B shows various examples of how the adhesive may be deposited; however, these are not limitations of the present invention, and in other embodiments adhesive may be dispensed in other ways and/or patterns. In various embodiments of the present invention, a single volume of adhesive may be dispensed over a portion of gap 410 and a portion of conductive traces 160 on either side of gap 410, for example as shown for adhesive 205. In various embodiments of the present invention, two or more separate volumes of adhesive may be dispensed for each component to be bonded to circuit board 165. In various embodiments of the present invention, a volume of adhesive may be dispensed over a portion of conductive trace 160, next to gap 410, for example as shown for adhesive 205" in FIG. 4B. In various embodiments of the present invention, a volume of adhesive may be dispensed over a portion of conductive trace 160 and a portion of gap 410, for example as shown for adhesive 205' in FIG. 4B. These examples are not meant to be limiting, and in other embodiments other adhesive-dispense geometries may be utilized, for example one or more volumes may be dispensed on substrate 120 within gap 410, or two or more volumes may be dispensed perpendicular to the plane of the drawing of FIG. 4B, or any other dispense geometry.

In various embodiments, the adhesive may be provided by dispensing, by jetting, by pressurized syringe dispense, printing, screen printing, ink jet printing, or the like. In some embodiments, the adhesive may be formed manually or in an automated or semi-automated fashion. The method of adhesive dispense is not a limitation of the present invention. In various embodiments of the present invention, adhesive 205 may be applied or dispensed on to the entirety of or only one or more portions of each of the components. For example, adhesive 205 may be applied to the entirety of or only a portion of one or more of the contacts of the component rather than or in addition to being dispensed on the circuit board. In various embodiments of the present invention, adhesive 205 may be applied to or dispensed on the entirety of or only one or more portions of each of the component(s) and/or on the circuit board.

In various embodiments, adhesive 205 includes, consists essentially of, or consists of an ACA. In various embodiments, the adhesive or ACA may include, consist essentially of, or consist of a liquid, a gel, a paste, or a film (e.g., anisotropic conductive film, ACF); the form of the adhesive or ACA is not a limitation of the present invention. In various embodiments, adhesive 205 may include, consist essentially of, or consist of a conductive adhesive (e.g., an isotropically conductive adhesive). ACAs may be utilized with or without stud bumps, and embodiments of the present invention are not limited by the particular mode of operation of the ACA. Furthermore, various embodiments may utilize one or more other electrically conductive adhesives, e.g., isotropically conductive adhesives, non-conductive adhesives, in addition to or instead of one or more ACAs. In various embodiments, the adhesive may be pre-dispensed on component 280, for example over all, substantially all or a portion of the bottom contact-containing face of component 280 (that is the face of component 280 that includes contacts 285), for example as described in U.S. patent application Ser. No. 13/784,417, filed on Mar. 4, 2013, U.S. patent application Ser. No. 13/784,419, filed on Mar. 4, 2013, and/or U.S. patent application Ser. No. 13/949,546, filed on Jul. 24, 2013, the entire disclosure of each of which is incorporated by reference herein, which, in various embodiments, eliminates the need for step 320.

In various embodiments of the present invention, adhesive 205 may be cured by application of one or more of heat, pressure, electromagnetic waves, microwaves, magnetic field, or optical radiation (for example UV radiation).

Figure 4C:
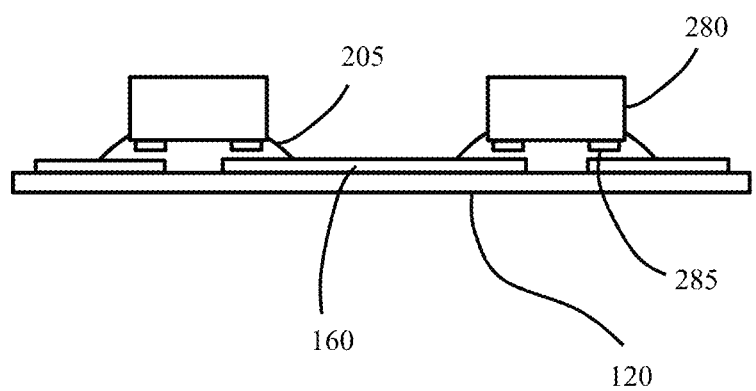

In step 330 of process 300, component 280 is positioned over substrate 120, conductive traces 160, and adhesive 205 as shown in FIG. 4C. In various embodiments of the present invention, component 280 is a bare (i.e., unpackaged) die, for example a bare semiconductor die, e.g., an integrated circuit, a transistor, a resistor, a capacitor, a diode, a light-emitting diode (LED), a laser, a solar cell, a light detector, or any other bare semiconductor die, also known as a semiconductor chip. In various embodiments of the present invention, component 280 is a packaged device, for example a packaged semiconductor device, e.g., a packaged integrated circuit, a packaged transistor, a packaged diode, a packaged LED, a packaged laser, a packaged solar cell, a packaged light detector, a packaged resistor, a packaged capacitor, a packaged inductor, or any other packaged device. In various embodiments of the present invention, component 280 is a packaged surface mount device (SMD); however, the specific package type is not a limitation of the present invention. In various embodiments, packaged components may utilize one or more different package types, for example molded packages, leaded packages, leadless packages, chip scale packages (CSP), plastic leaded chip carrier (PLCC), or the like. The specific type of bare die or packaged device is not a limitation of the present invention.

As shown in FIG. 4C, component 280 may have one or more contacts 285, and in various embodiments of the present invention, at least a portion of contact 285 is positioned over at least a portion of conductive trace 160, such that after curing, an electrically conducting pathway is formed from conductive trace 160 to contact 285, for example through adhesive 205. In various embodiments of the present invention, one or more stud bumps, as described in reference to FIG. 1A, may also be incorporated into the structure between the trace 160 and the contact 285 (e.g., in contact with or as part of the trace 160 and/or in contact with or as part of the contact 285).

Components 280 may be placed on circuit board 165 by a number of means, for example using die bonders, pick-and-place tools, manual placement, semi-automated placement, fully automated placement, or the like. The method of component placement is not a limitation of the present invention.

While FIG. 4C shows two components 280, this figure is meant to be exemplary and the number of components is not a limitation of the present invention. In various embodiments, this technique may be applied to tens, hundreds, thousands, or more components serially or substantially simultaneously. While FIG. 4C shows two of the same components 280, this is not a limitation of the present invention, and in other embodiments different components, for example having different areas, heights, pad configurations, or the like, may be processed serially or simultaneously. The quantity, type, and spacing of components are not limitations of the present invention. Indeed, as described herein, one advantage of embodiments of the present invention is the ability to substantially simultaneously treat two or more different types and/or sizes of components.

Figure 4D:
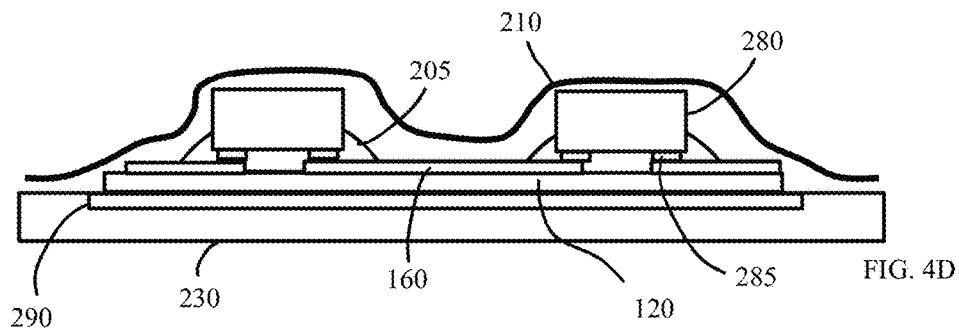

In step 340, a membrane is provided. In step 350, membrane 210 is placed over the circuit board and components, for example as shown in FIG. 4D. One purpose of membrane 210 is to distribute the gas or fluid pressure that is applied to membrane 210 to components 280 in a uniform or substantially uniform fashion. In various embodiments, the pressure is applied to components 280 substantially independently of component height, shape, and/or spacing. In various embodiments of the present invention, membrane 210 may cover all components 280; however, this is not a limitation of the present invention, and in other embodiments membrane 210 may only cover one or some of components 280 on circuit board 165. For example, in various embodiments of the present invention, the components on a circuit board may be cured in more than one step, that is some of the components may be cured, and then a second (or more) group may be subsequently cured.

In various embodiments of the present invention, membrane 210 may include, consist essentially of, or consist of one or more of the following materials: nylon, polyethylene, polyester, or silicone. In various embodiments of the present invention, membrane 210 may be stretchable, for example able to stretch up to at least about 50% of its original length, up to at least about 100% of its original length, up to at least about 250% of its original length, up to at least about 500% of its original length, or more. Examples of suitable membranes include Stretchlon 200 and Stretchlon 800 manufactured by Airtech International. In various embodiments of the present invention, membrane 210 may be used only once, for example for only one cure process; however, this is not a limitation of the present invention, and in other embodiments membrane 210 may be used multiple times. In various embodiments of the present invention, membrane 210 may be clear or transparent; however, this is not a limitation of the present invention, and in other embodiments membrane 210 may be translucent or opaque. In various embodiments of the present invention, membrane 210 may include, consist essentially of, or consist of one material or multiple materials; for example, membrane 210 may include, consist essentially of, or consist of a film having layers of multiple different materials, in which each layer or material may have different mechanical and/or thermal properties. In various embodiments of the present invention, different materials of construction of membrane 210 may be utilized to meet different process and manufacturing needs, for example process temperatures, process duration, flexibility, cost, and/or membrane longevity. In some embodiments, a flexible membrane 210 is configurable to a radius of curvature of about 1 m or less, or about 0.5 m or less, or even about 0.1 m or less. In some embodiments, flexible membrane 210 has a Young's Modulus less than about 100 N/m$^2$, less than about 1 N/m$^2$, less than about 0.1 N/m$^2$, or even less than about 0.05 N/m$^2$. In some embodiments, a flexible membrane 210 has a Shore A hardness value less than about 100; a Shore D hardness less than about 100; and/or a Rockwell hardness less than about 150.

In various embodiments of the present invention, circuit board 165 may be positioned over or on a base, for example base 230 as shown in FIG. 4D. While circuit board 165 is shown being positioned on base 230 in step 340, this is not a limitation of the present invention, and in other embodiments circuit board 165 may be positioned on base 230 during a different stage of the process, or base 230 may not be utilized. In various embodiments, base 230 may incorporate a means of providing heat to circuit board 165, and in particular to providing heat to adhesive 205 for the curing process. FIG. 4D shows base 230 incorporating heater 290, although in other embodiments base 230 may incorporate more than one heater, or one or more heaters may be incorporated in other portions of the apparatus, or a heater may not be part of the apparatus. For example, in various embodiments of the present invention the structure of FIG. 4D, but without heater 290, may be placed in an autoclave, an oven, or a similar apparatus that provides a means for heating of (and even, in various embodiments, application of pressure to) membrane 210. In various embodiments of the present invention, curing may be performed using other energy sources (e.g., UV lamps or other UV light sources), as described herein, and in such cases appropriate equipment may be utilized for such cure processes.

Figure 4E:
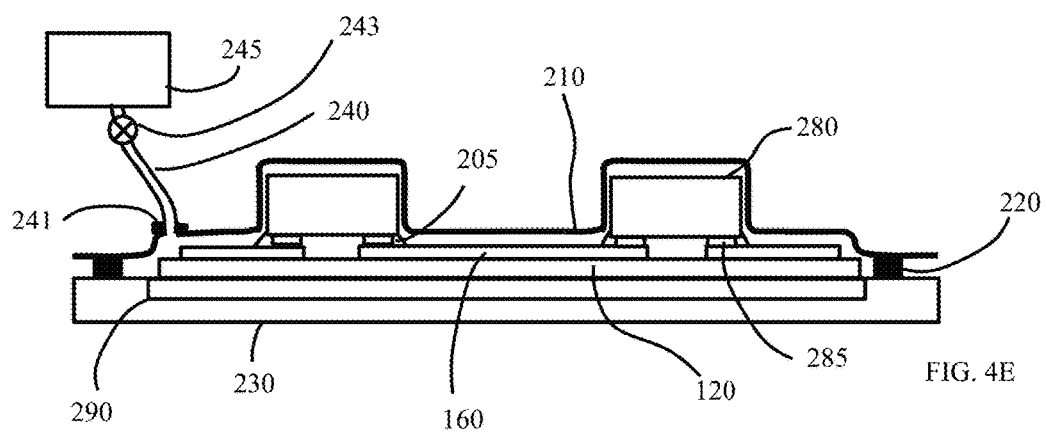

In various embodiments of the present invention, membrane 210 may be sealed to base 230, for example to permit evacuation of air between circuit board 165 and membrane 210 in step 360, as described herein. FIG. 4E shows seal 220 providing a seal between membrane 210 and base 230; however, this is not a limitation of the present invention, and in other embodiments seal 220 may be between membrane 210 and other elements of the system, for example substrate 120, one or more conductive traces 160, or the like. In various embodiments of the present invention, seal 220 may not be utilized. In various embodiments of the present invention, seal 220 may be a one-time seal, for example an adhesive, glue, tape, or sealant tape, for example Gray or Yellow sealant tape from Fiberglast Development Corporation. In various embodiments of the present invention, seal 220 may be reusable. Examples of reusable seals include o-rings, gaskets, or the like.

In step 360, the air may be evacuated from between membrane 210 and the circuit board, for example the air or fluid may be evacuated from region 212 of FIG. 2A. FIG. 4E shows a port 241 attached to membrane 210, to which is attached a hose or tube 240 coupling the region between membrane 210 and circuit board 165 to vacuum source 245. A valve 243 may be optionally positioned between vacuum source 245 and port 241 to permit control of the application of vacuum from vacuum source 245 to the region under membrane 210. In various embodiments of the present invention, membrane 210 may be sealed to a base, for example base 230 as shown in FIG. 4E; however, this is not a limitation of the present invention, and in other embodiments seal 220 may not be present or membrane 220 may seal itself to base 230 or another portion of the apparatus by the application of vacuum. In various embodiments of the present invention, vacuum source 245 may include one or more of the following: vacuum pump, vacuum generator, house vacuum source, or the like. The means of generating a vacuum or negative pressure is not a limitation of the present invention. While the apparatus of FIG. 4E shows port 241 attached to or formed within membrane 210, this is not a limitation of the present invention, and in other embodiments the air or fluid may be evacuated or partially evacuated through other parts of the apparatus, for example through base 230.

In various embodiments of the present invention, the air or fluid may be evacuated from under membrane 210, and vacuum source 245 may be removed (e.g., valve 243 and/or port 241 may be closed) prior to curing the adhesive. In various embodiments of the present invention, the atmosphere under membrane 210 may be continuously evacuated by vacuum source 245 during the curing stage. In various embodiments of the present invention, a separate vacuum source may be part of a pressure chamber, for example a pressure chamber (as described herein) used to apply pressure to the exterior of membrane 210.

In various embodiments of the present invention, heater 290 may be on or part of base 230 and may be a thin-film heater, for example including one or more resistive heater traces on a heater substrate. In various embodiments, the heater substrate may include or consist essentially of silicone, polyimide (e.g., Kapton), or the like. Other means of heating may also be utilized, for example induction heating, lamp heating, infrared (IR) lamp heating, radio frequency (RF) induction heating, thermoelectric heating, rapid thermal heating (e.g., using induction or radiation), microwave heating, fluid heating, or the like. In various embodiments of the present invention, a fluid may be used to apply pressure (i.e., positive pressure) to the exterior of membrane 210. In various embodiments, the fluid may be heated, resulting in heating of membrane 210 and adhesive 205. In various embodiments of the present invention, one or more heaters may be incorporated within or as part of membrane 210. For example, one or more resistive heater traces may be incorporated on or within membrane 210.

In various embodiments of the present invention, adhesive 205 is an ACA and the ACA cure process first applies pressure and then cures the adhesive to lock or freeze the conductive particles in place, such that after removal of the pressure, there is little or no movement of the conductive particles within the adhesive matrix of the ACA. This maintains an electrically conducting pathway between conductive trace 160 through the conductive particle(s) to contact 285. In such embodiments, it may be preferable to first apply the pressure and then to cure the adhesive, for example by application of heat, UV radiation, or the like; however, this is not a limitation of the present invention, and in other embodiments other temperature-pressure-time cure profiles may be used. For example, in various embodiments it may be advantageous to heat the adhesive to a temperature below the cure point prior to or while applying pressure, for example to achieve a reduction in viscosity of the adhesive, before applying pressure and curing the adhesive. In various embodiments, the temperature and/or pressure may be constant or substantially constant during the cure process, while in other embodiments the temperature and/or pressure may change during the cure process. For example, in various embodiments of the present invention, the adhesive may be cured using the following process conditions: a force in the range of about 0.5 N to about 10 N, a cure time in the range of about 5 seconds to about 360 seconds, and a cure temperature in the range of about 60° C. to about 350° C. In various embodiments, the adhesive may be Delo 265 and the cure process includes a force of about 1.3 N to about 10 N, a time in the range of about 5 seconds to about 30 seconds, and a temperature in the range of about 150° C. to about 210° C.

In step 370, pressure is applied to the membrane. For example, in various embodiments pressure may be applied over membrane 210, which forces membrane 210 onto components 280, which applies the pressure to the adhesive. In various embodiments of the present invention, pressure may be applied by placing the system (or parts of the system) of FIG. 4E into a pressure chamber, for example pressure chamber 250 as shown in FIG. 2B. The pressure within chamber 250 is controlled by pressure source 270 which is applied to pressure chamber 250 through pressure regulator 272, valve 274, and tube 275. In various embodiments, pressure chamber 250 may include a pressure relief valve 255, to prevent over-pressure of chamber 250.

In various embodiments of the present invention, the pressure in the chamber may be increased by applying a pressurized fluid from pressure source 270 to the interior of chamber 250. In various embodiments of the present invention, the pressurized fluid may be a gas, for example nitrogen, argon, air, or the like. In various embodiments of the present invention, the pressurized fluid may be a liquid, for example water, ethylene glycol, silicone oil, or the like.

In some embodiments of the present invention, the pressurized fluid may also be heated to aid in heating or provide the heat for curing the adhesive.

In various embodiments of the present invention, pressure may be applied solely by evacuating or partially evacuating the air or fluid under membrane 210. In various embodiments of the present invention, evacuating the air under membrane 210 may result in a pressure substantially equal to atmospheric pressure, for example in the range of about 14 to about 15 pounds per square inch. In various embodiments of the present invention, pressure may be applied by a combination of by evacuating or partially evacuating the air or fluid under membrane 210 and application of pressure over membrane 210.

In step 380, the adhesive is cured. In various embodiments, the adhesive is cured by application of heat, as described herein; however, this is not a limitation of the present invention, and in other embodiments curing may be accomplished by other means, for example exposure to other forms of energy, moisture, radiation (e.g., UV radiation), or the like. In various embodiments, curing may be accomplished using more than one means, for example heat and UV radiation or moisture and heat. In various embodiments, heat may be introduced by various means, for example electrical heaters, infrared radiation, microwave radiation, induction heating, thermoelectric heating, or the like. In various embodiments, the cure profile (time and temperature) is dependent on the characteristics of the adhesive. In various embodiments, the temperature may be in the range of about 50° C. to about 350° C. In various embodiments, the cure temperature may be reduced by increasing the cure time. The cure temperature and time are not limitations of the present invention.

In various embodiments of the present invention, heat is applied before the pressure is applied, while in other embodiments heat and pressure are applied simultaneously or substantially simultaneously, or heat may be applied after pressure is applied. In various embodiments of the present invention, the temperature of the adhesive ramps up from its starting value over a period of time, and the heater may be turned on at the same time or substantially the same time as the pressure is applied, such that the desired pressure is reached before the final cure temperature is reached.

After the adhesive is cured, the circuit board with associated components and cured adhesive may be removed from the pressure curing system.

In various embodiments, the time for one cure cycle may be in the range of about 5 seconds to over 2 hours. In various embodiments, the cure cycle time is dependent on the rate of heating and cooling. In systems having relatively large thermal mass, such as an autoclave, the cycle time may be about two hours or more, or about one hour or less, or about 30 minutes or less. For systems having relatively lower thermal mass, the cycle time may be less than about 10 minutes, or less than about 1 minutes, or less than about 30 seconds, or less than about 10 seconds. In various embodiments, the cure system may incorporate thermal insulation and/or active or passive cooling to aid in quickly attaining the desired process conditions and/or to reduce cycle time. For example, in various embodiments, cooling, for example air, water, fluid, thermoelectric, or other means of cooling, may be utilized to reduce the cooling time of the system. In various embodiments, insulation may be utilized to reduce the heating time of the system, for example to reduce heating of portions of the system outside of the cure region (i.e., the region containing the adhesive being cured). FIG. 2C shows an apparatus that may be used in accordance with embodiments of the present invention; however, this is not a limitation of the present invention, and in other embodiments other apparatuses may be used. For example, in one embodiment of the present invention, the process may take place in an autoclave. In such embodiments, the pressure within the chamber is increased and the entire chamber is heated, for example using heaters within the chamber, but not necessarily under the circuit board and associated components. In various embodiments of the present invention, the circuit board and associated components may be heated from above, or from both above and below, to cure the adhesive.

It will be understood by those skilled in the art that the cure conditions involve a combination of factors, e.g., the time-temperature and time-pressure profile, and that these may be varied to find suitable conditions for curing without undue experimentation. For example, in various embodiments of the present invention the cure time may be reduced by increasing the cure temperature, while in other embodiments the cure temperature may be reduced by increasing the cure time. In various embodiments of the present invention, the applied pressure profile may also affect the temperature profile.

Figure 5A:
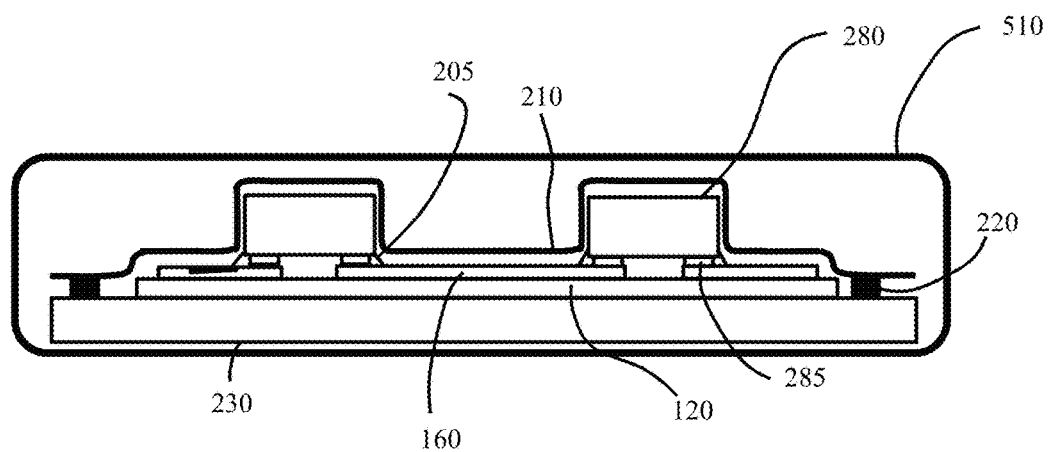
FIGS. 5A and 5B are schematic illustrations of curing systems in accordance with various embodiments of the invention.

FIG. 5A shows an apparatus used in accordance with embodiments of the present invention. The apparatus of FIG. 5A is similar to that of FIG. 2C; however, in FIG. 5A pressure chamber 250 and heater 290 are replaced by a chamber 510 that provides both pressure and heat, for example an autoclave-type chamber (the means for applying and controlling the pressure and heat in chamber 510 are not shown in FIG. 5A, but such systems are commercially available and such means are well understood). In various embodiments, chamber 510 may be relatively large and multiple circuit boards or items may be cured simultaneously. For example, many circuit boards with membrane 210 on base 230 may be placed in chamber 510 for simultaneous curing, for example on racks or shelves within chamber 510. Multiple such circuit boards may be disposed beneath a single membrane 210 and/or on a single base 230, or each circuit board may have its own dedicated membrane 210 and/or base 230.

In various embodiments, additional elements may be added to the system and process, for example to increase throughput or control of the process. For example, in various embodiments, one or more pressure sensors may be positioned within chamber 250 or chamber 510 to measure and/or control the pressure. In various embodiments, the pressure may be changed in the chamber in a step-wise or relatively step-wise fashion, while in other embodiments the pressure may be more gradually changed, or continuously or substantially continuously changed over a period of time. As discussed herein, one or more temperature monitors may be placed within chamber 250 or chamber 510, for example in the chamber, on one or more conductive traces 160, for example near adhesive 205 or in other locations, to measure and/or control the temperature during the process. In various embodiments, the temperature may be changed in the chamber in a step-wise or relatively step-wise fashion, while in other embodiments the temperature may be more gradually, continuously, or substantially continuously increased over a period of time. In various embodiments, a means for cooling the sample and/or chamber after curing may be incorporated, for example to increase throughput. For example, in various embodiments, cooling may be accomplished using gas or air cooling, water cooling, thermo-electric cooling, liquid nitrogen cooling, or the like. In various embodiments, the heating, pressure, and cooling characteristics as a function of time may be optimized for desired processing conditions and high throughput. In various embodiments, the entire cure process may take place in less than 2 minutes, or less than 1 minute, or less than 30 seconds, or less than 15 seconds.

Figure 5B:
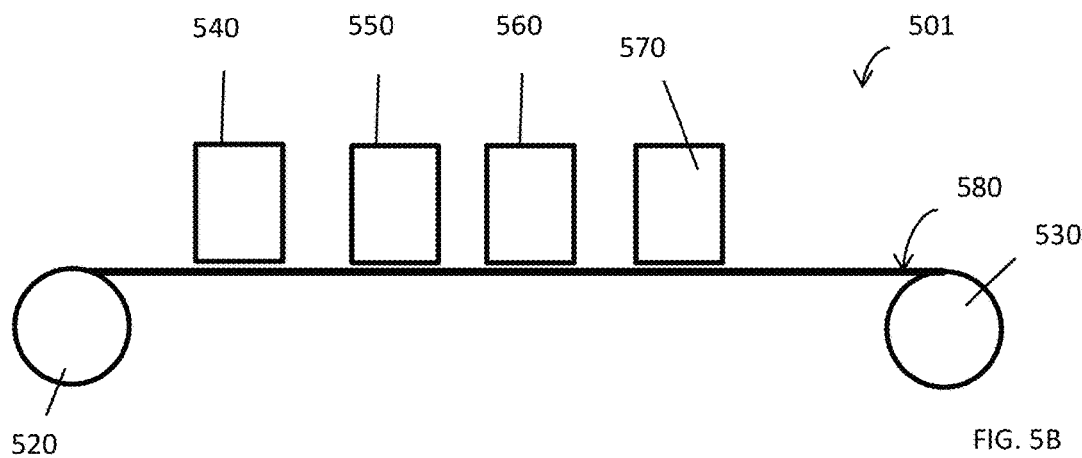

In various embodiments, circuit boards may be cured using the process of the present invention in a batch process. For example a circuit board may be loaded into the system, for example as shown in FIG. 2C or FIG. 5A, and the adhesive cured and the circuit board removed. However, in various embodiments the circuit board may include or consist essentially of a web supplied from a supply roll for roll-to-roll processing. FIG. 5B shows an exemplary embodiment of a roll-to-roll system for package and/or die attach using the pressure cure process of embodiments of the present invention. FIG. 5B shows a system 501 including a web 580 that is supplied from a supply roll 520 and taken up on a take-up roll 530, as well as various process stations, including an adhesive dispense station 540, a component placement station 550, a pressure cure station 560, and an optional test station 570 (for, e.g., electronically testing one or more of the bonded components after the adhesive is cured).

The pressure cure station 560 may include or consist essentially of, e.g., any of the components described herein in conjunction with pressure-application and curing. The adhesive dispense station 540 may include a reservoir for containing the adhesive and from which the adhesive may be dispensed. The adhesive dispense station 540 may also include one or more mechanisms for dispensing the adhesive, e.g., one or more jets, one or more syringes, one or more print heads (e.g., ink jet print heads), etc. The component placement station 550 may include or consist essentially of one or more mechanisms for placing the components over their respective connection points, e.g., one or more die bonders, one or more pick-and-place tools, etc. The test station 570 may include or consist essentially of, for example, one or more testing-station components as detailed in U.S. patent application Ser. No. 14/949,089, filed on Nov. 23, 2015, the entire disclosure of which is incorporated by reference herein. For example, the test station 570 may include a power source for applying power (e.g., current and/or voltage) to one or more of the bonded components, one or more electrical probes for electrically contacting the components (e.g., a probe card), as well as one or more analyzers for analyzing electrical and/or optical output of the components, e.g., a spectrometer, an integrating sphere, a voltmeter, an ammeter, a source measure unit (i.e., a unit capable of sourcing (providing power to) and measuring (for example measuring a voltage or current of) one or more components at the same time), and/or a still and/or video camera.

Figure 6:
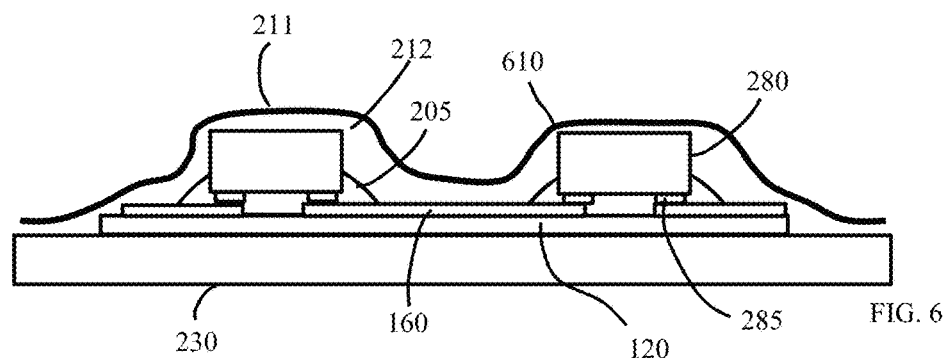
FIG. 6 is a schematic illustration of a curing system in accordance with various embodiments of the invention.

In various embodiments, membrane 210 may include or incorporate one or more heating elements that may be used to provide heat to cure adhesive 205. FIG. 6 shows a schematic of an embodiment of the present invention in which a membrane 610 incorporates one or more heating elements. In this embodiment, one or more heating elements within or part of membrane 610 provide the heat for curing, while pressure applied via membrane 610 provides the pressure for curing. In various embodiments, membrane 610 may include, consist essentially of, or consist of silicone, silicone rubber, polyester, Kapton, polyimide, or the like. The heating elements incorporated into the membrane 610 may include, consist essentially of, or consist of, for example, wires or other resistive heating elements.

Figure 7A:
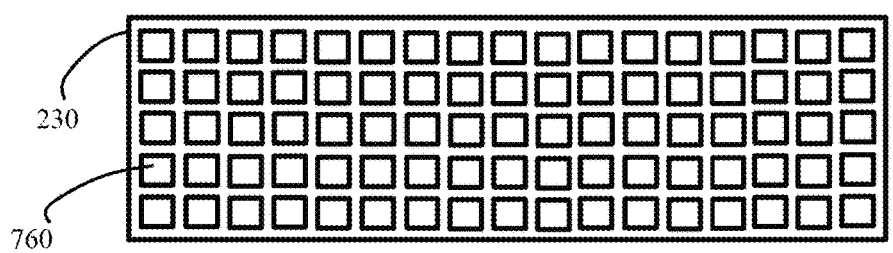
FIG. 7A is a schematic plan view of a heater in accordance with various embodiments of the invention.
Figure 7B:
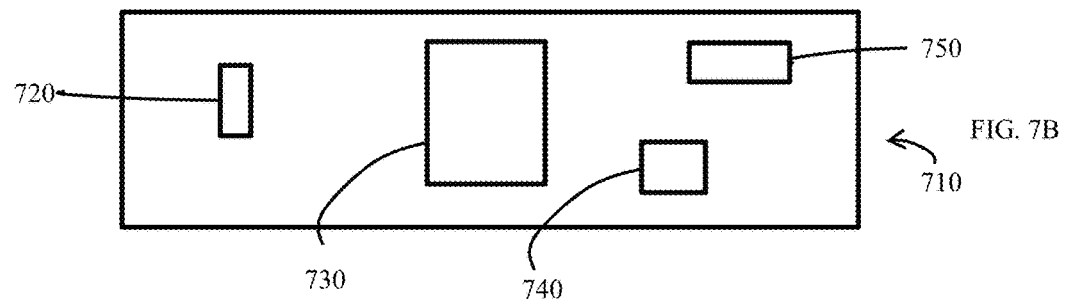
FIG. 7B is a schematic plan view of an exemplary layout of electronic devices to be cured in accordance with various embodiments of the invention.
Figure 7C:
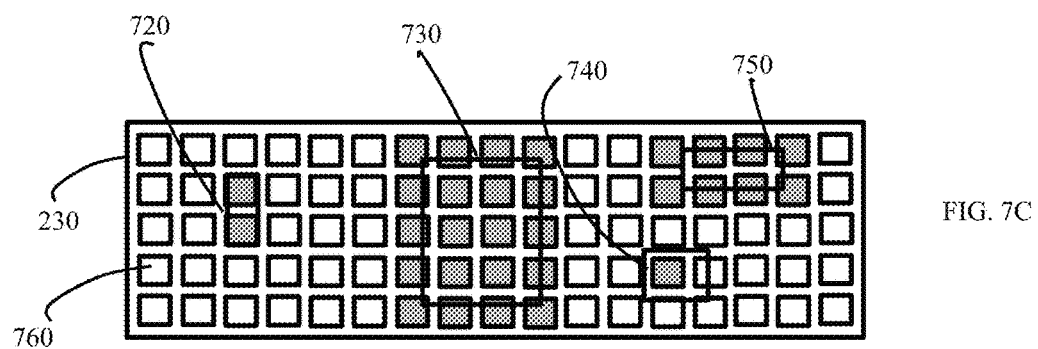
FIG. 7C is a schematic plan view of the heater of FIG. 7A with selected heating elements activated to cure the electronic devices of FIG. 7B.

In various embodiments of the present invention, heater 290 may include or consist essentially of an array of addressable heating elements, such that heat may be applied selectively to various regions of the circuit board or assembly containing material to be cured. FIG. 7A shows a schematic top view of one embodiment of an addressable heater featuring multiple heating elements 760 on base 230. While FIG. 7A shows each individual heating element 760 as having a square shape, this is not a limitation of the present invention, and in other embodiments heating elements 760 may have different shapes, for example triangular, circular, hexagonal, rectangular, or any other shape or any arbitrary shape. While FIG. 7A shows heating elements 760 arranged in a regular periodic array, this is not a limitation of the present invention, and in other embodiments heating elements 760 may be arranged in different patterns. FIG. 7B shows a schematic of a circuit board 710 having four components 720, 730, 740, and 750 that are to be cured. FIG. 7C shows a schematic of the heater of FIG. 7A, with some of heating elements 760 activated for applying heat in the regions of components 720, 730, 740, and 750, while other heating elements 760 are not activated (i.e., not actively applying heat). In FIG. 7C activated heating elements 760 are indicated by a grey color. In various embodiments, the area of heating elements 760 that are activated may be larger than the corresponding component, for example as shown for components 730 and 750, or may be smaller than the component, for example as shown for component 740, or may be substantially the same size, as shown for component 720. In various embodiments, heating elements 760 may be programmed to be activated or deactivated based on a drawing, picture, CAD file, or file or other representation of the position of the components to be cured. Such representations may be stored as digital information in a computer memory incorporated within or in communication with a computer-based control system that controls the activation of the heating elements 760. In various embodiments, circuit board 710 may be imaged or scanned and the appropriate heating elements determined from the image or scan. In various embodiments, a heating element 760 may be off or on, while in other embodiments the temperature for different heating elements 760 may be different (and/or each heating element 760 may be programmed to apply heat at any one of multiple different levels), for example to provide different amounts of heat to different components, or to provide specific lateral or vertical thermal profiles. In various embodiments, all heating elements 760 may be activated or deactivated simultaneously; however, this is not a limitation of the present invention, and in other embodiments various heating elements may be activated at different times, for example to provide different amounts of heat to different components, or to provide specific lateral or vertical thermal profiles. In various embodiments of the present invention, various components may have different thermal conductivities, different thicknesses, different contact areas or have other differences that may result in different heating rates, and in some embodiments curing may be accomplished using one temperature/time profile, for example as described with respect to FIG. 3, while in other embodiments it may be advantageous to provide different temperature/time profiles for different areas of the circuit board or assembly to be cured.

Figure 8:
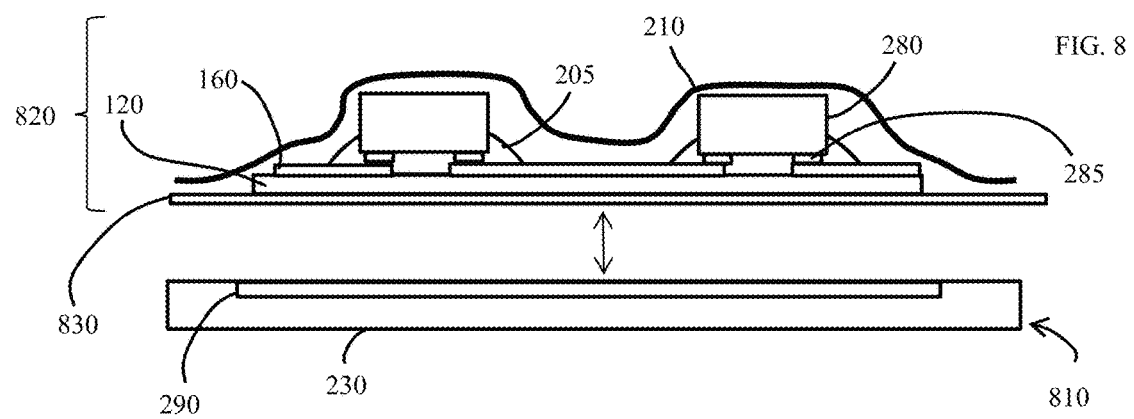
FIG. 8 is a schematic illustration of a curing system in accordance with various embodiments of the invention.

In various embodiments, mechanical movement of the heater and/or the component to be cured may be utilized to provide a relative increase in heating and/or cooling rates, for example by bringing the assembly or circuit board to be cured into contact with a relatively hot heater to increase the heating rate and/or by separating the assembly or circuit board from the heater after curing is complete to increase the cooling rate. For example, FIG. 8 shows an embodiment of a curing apparatus incorporating a heater portion 810 and a mounting portion 820 in accordance with embodiments of the present invention. In the apparatus shown in FIG. 8, heater portion 810 may be kept relatively hot and then be mated with or brought into proximity to mounting portion 820 to provide an increased heating rate to achieve the desired curing temperature more quickly. After curing is complete, heater portion 810 may be separated from mounting portion to provide relatively fast cooling. In various embodiments, heater portion 810 may move while mounting portion 820 is fixed, or heater portion 810 may be fixed and mounting portion 820 may move, or both heater portion 810 and mounting portion 820 may be movable. In various embodiments, a support 830 may be provided as part of mounting portion 820 to provide support for substrate 120. FIG. 8 shows mounting support 830 extending across all of substrate 120; however, this is not a limitation of the present invention, and in other embodiments support 830 may support only one or more portions of substrate 120, for example to provide reduced thermal resistance between heater 290 and substrate 120.

In various embodiments, pressure cure systems in accordance with embodiments of the present invention may be used to manufacture lighting systems that include, for example, light-emitting elements (LEEs) disposed on a rigid or flexible circuit board. In various embodiments, the pressure cure system may be used to cure ACA for LEE applications as described in the '973 application. In various embodiments, such lighting systems may include an array of LEEs and optionally one or more control elements, for example to control or regulate the current to the LEEs, for example as described in U.S. patent application Ser. No. 13/799,807, filed on Mar. 13, 2013, and U.S. patent application Ser. No. 13/970,027, filed on Aug. 19, 2013, the entire disclosure of each of which is incorporated by reference herein. In various embodiments, the LEEs may include, consist essentially of, or consist of light-emitting diodes (LEDs) that may emit light in a relatively narrow spectral range to produce various colors such as red, green or blue, or that may emit white or substantially white light, for example having a correlated color temperature in the range of about 1800K to about 20,000K.

In various embodiments of the present invention, one or more additional materials may be positioned between the membrane and the assembly (e.g., the components being bonded and the substrate to which they are being bonded). For example, in various embodiments one or more films may be positioned between the membrane and the assembly, such that after curing, the film is adhered to and disposed over the assembly (e.g., disposed over the components on the circuit board). In various embodiments of the present invention, the film may cover one or more or all components and/or all or substantially all or one or more portions of the substrate. In various embodiments, the film may include, consist essentially of, or consist of one sheet of material before curing; however, this is not a limitation of the present invention, and in other embodiments the film may include, consist essentially of, or consist of two or more sheets or layers. For example, the film may include, consist essentially of, or consist of two or more sheets positioned adjacent to each other and/or more than one sheet positioned over all or a portion of another sheet. In various embodiments, the film may provide various advantageous attributes to the assembly after curing. For example, the film may facilitate the ability to achieve a specific stiffness or flexibility level of the assembly, to achieve a desired flammability rating of the assembly, to achieve a desired level of protection of the assembly (e.g., protection from mechanical forces such as impact, shear, abrasion, and the like), and/or to provide ingress protection (e.g., from dirt, particles, liquid, water, water vapor, and the like). In various embodiments of the present invention, the film may conformally or substantially conformally cover the assembly after curing. For example, the film may conformally cover one or more components on or in the assembly; however, this is not a limitation of the present invention, and in other embodiments the film may not be conformal or may not be substantially conformal.

Figure 9A:
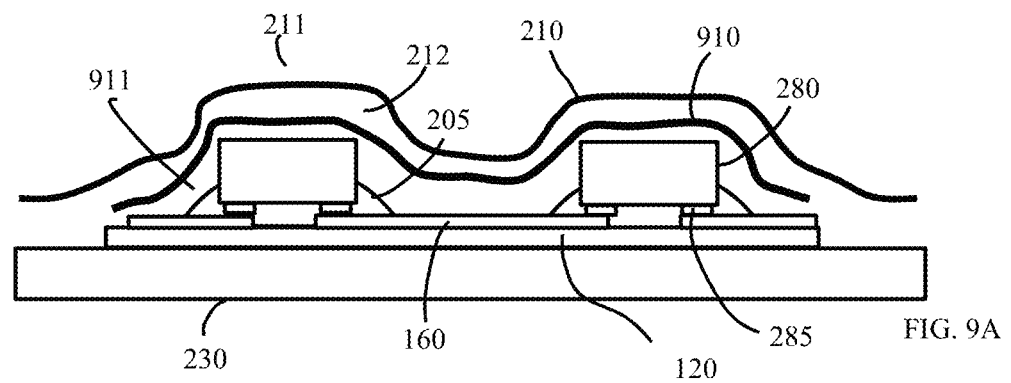
FIG. 9A is a schematic cross-section of a substrate prior to curing in accordance with various embodiments of the invention.
Figure 9B:
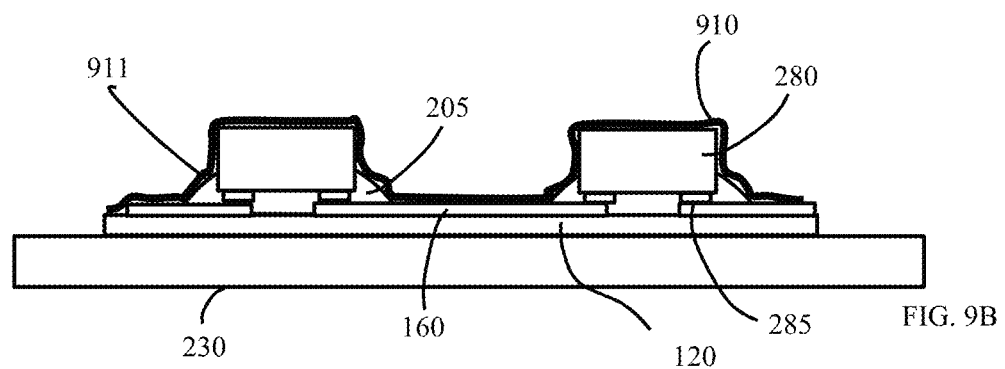
FIG. 9B is a schematic cross-section of the substrate of FIG. 9A after curing.

FIG. 9A shows a schematic of one embodiment of the present invention prior to curing. The configuration shown in FIG. 9A is similar to that shown in FIG. 2A, but with the addition of a film 910 positioned under membrane 210. As shown in FIG. 9A, film 910 is positioned over at least a portion of one or more components 280, conductive traces 160, and substrate 120; however, as discussed herein, this is not a limitation of the present invention, and in other embodiments film 910 may have different relationships to the positions of components 280, conductive traces 160, and/or substrate 120. Below film 910 is a region 911. FIG. 9B shows the structure of FIG. 9A after curing and after removal of membrane 210. As shown, after curing the file 910 may substantially conformally coat at least a portion of one or more components 280, and/or at least a portion of one or more conductive traces 160, and/or at least a portion of substrate 120.

In various embodiments of the present invention, film 910 may be a curable film. In various embodiments of the present invention, film 910 and adhesive 205 may be cured together in a single cure cycle. For example, in various embodiments, adhesive 205 may be cured to adhere and electrically couple a component to an underlying circuit board and, within the same cure cycle, film 910 may be cured to form a layer (e.g., a protective layer) over the components and the circuit board.

In various embodiments curing of film 910, for example with heat, radiation (e.g., infrared or ultraviolet or visible radiation or the like), or by other means, may induce physical or chemical cross-linking within film 910. In various embodiments, film 910 may be a thermoset material, while in other embodiments film 910 may be a thermoplastic material. In various embodiments curing of film 910 may include melting or partial melting and subsequent solidification. In various embodiments, film 910 may be flexible or substantially flexible, while in other embodiments film 910 may be rigid or substantially rigid. In various embodiments, film 910 may be transparent to a wavelength of light emitted by a light-emitting component (e.g., an LEE) below the film 910. In various embodiments, film 910 may have a transmittance greater than about 50%, or greater than about 75%, or greater than about 90%, or greater than about 95%, to a wavelength of light emitted by the light-emitting component. In various embodiments, the temperature for curing of a structure including film 910 may occur in a temperature range of about 50° C. to about 250° C., or in the range of about 80° C. to about 170° C., or in the range of about 100° C. to about 150° C. In various embodiments, the time for curing of a structure including film 910 may be in the range of about 1 minute to about 2 hours, or in the range of about 5 minutes to about 1 hour, or in the range of about 7 minutes to about 45 minutes.

In various embodiments of the present invention, film 910 may include, consist essentially of, or consist of one or more of the following materials: ethylene vinyl acetate (EVA), polyurethane, thermoplastic polyurethane (TPU), thermoplastic polyolefin (TPO), ethylene tetrafluoroethylene (ETFE), polyester, polyethylene terephthalate (PET), polyethylene naphthalate (PEN), polycarbonate, polyethersulfone, polyimide, polyethylene, acrylic, plastic, or the like. In various embodiments, film 910 may include, consist essentially of, or consist of an aromatic TPU or an aliphatic TPU.

Figure 9C:
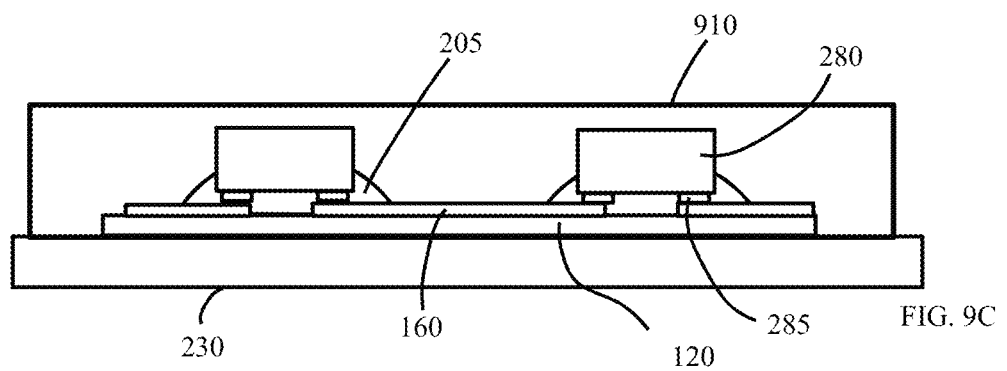
FIGS. 9C-9E are schematic cross-sections of substrates after curing in accordance with various embodiments of the invention.

While FIG. 9B shows film 910 having a thickness that is relatively small compared to the height of the components on the circuit board, this is not a limitation of the present invention, and in other embodiments, film 910 may have any thickness. For example, in various embodiments, film 910 may have a thickness greater than the height of one or more of the components on the circuit board. In various embodiments, film 910 may act to planarize or substantially planarize the surface of the structure, for example as shown in FIG. 9C. In various embodiments, film 910 may have a thickness in the range of about 10% to about 500% of the thickness of a component on the circuit board. In various embodiments, film 910 may have a thickness in the range of about 10 μm to about 10 mm, or in the range of about 100 μm to about 1 mm; however, in other embodiments film 910 may have a different thickness or may have a variable thickness across its area.

In various embodiments of the present invention, film 910 may be configured to protect the underlying components, e.g., components 280 or other components and/or the circuit board or substrate itself, for example to provide mechanical protection, protection from dust, water, etc. One method for rating different levels of environmental protection is an IP rating as specified by International Protection Marking in International Electrotechnical Commission (IEC) standard 60529, providing classification of degrees of protection provided by enclosures for electrical equipment, the entirety of which is hereby incorporated by reference herein. In various embodiments of the present invention, the structures of FIGS. 9B and 9C may have any IP rating, for example from IP00 to IP 69k, or any other IP rating. In various embodiments of the present invention, the structures of FIGS. 9B and 9C may have an IP 44 rating, an IP65 rating, an IP66 rating, an IP67 rating, or an IP68 rating. In general for an IP XY rating, "X" indicates the level of protection for access to electrical parts and ingress to solid foreign objects, while "Y" indicates the level of protection for ingress of harmful water. For example, an IP44 rating provides access and ingress protection for objects greater than about 1 mm and protection from water splashing on the system. In another example, an IP66 rating provides a dust-tight enclosure and protection from water jets incident on the system. Specific details of the requirements and test method are detailed within the IP specification. After provision of the film 910, the substrate 120 and the components bonded thereto may be separated from base 230.

Figure 9D:
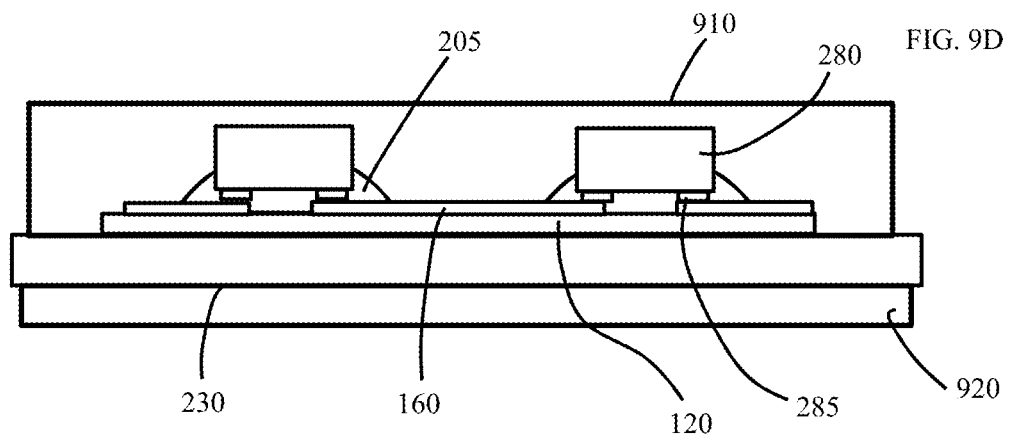
Figure 9E:
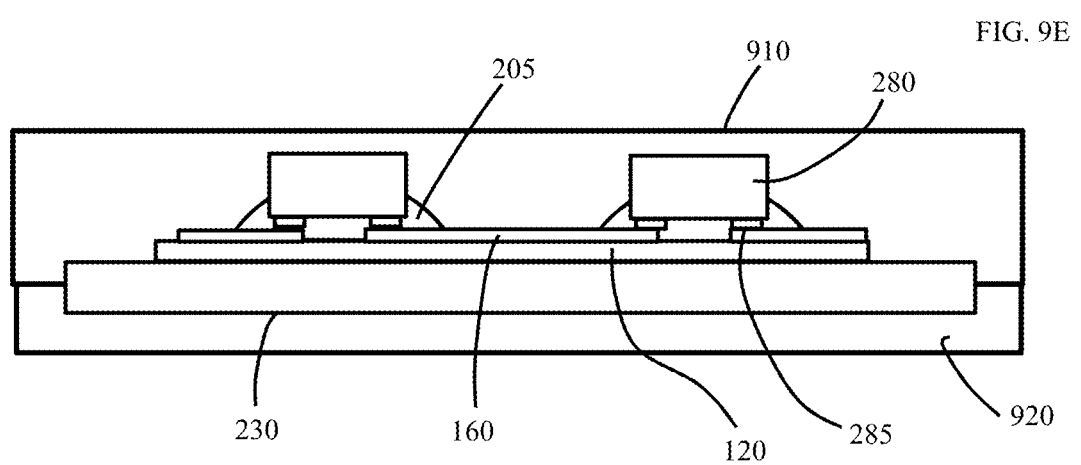

In various embodiments, a film 920 may be disposed on the back of the structure (e.g., on the surface of substrate 120 opposite the surface on which the components 280 are bonded), for example to provide additional protection or to meet certain aesthetic or handling concerns. For example, in FIG. 9D film 920 is disposed on the back of the substrate while film 910 is disposed on the front of the substrate. In various embodiments, film 910 may have the same or substantially the same thickness as film 920; however, this is not a limitation of the present invention, and in other embodiments film 910 may be thicker or thinner than film 920. In various embodiments, the substrate may be enclosed or encapsulated by films 910 and 920, as shown in FIG. 9E. In various embodiments, film 910 may cover less area of the substrate than film 920, as shown in FIG. 9D; however, this is not a limitation of the present invention, and in other embodiments film 910 may cover the same, substantially the same or more area of the substrate than is covered by film 920. The type of material, thickness, cure temperature, hardness, transmittance, and color of films 910, 920 are not limitations of the present invention.

Figure 9F:
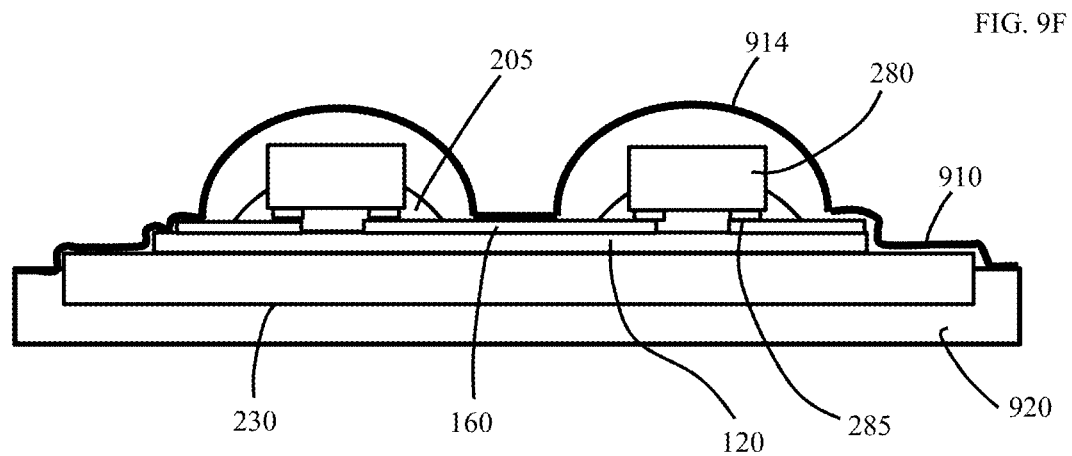
FIG. 9F is a schematic cross-section of an electronic device incorporating a shaped film in accordance with various embodiments of the invention.

In various embodiments, film 910 and/or 920 may have features formed in or on them before being attached to the circuit board. For example film 910 may have bumps, protrusions, recesses, or other features which may fit over one or more components 280. For example, FIG. 9F shows film 910 having bumps 914 after curing. In various embodiments, the shape of the bumps may be the same or substantially the same after curing as before curing; however, this is not a limitation of the present invention, and in other embodiments the shape may change during and/or after curing. In various embodiments, shaped films such as shown in FIG. 9F may include, consist essentially of, or consist of at least one of the following: ethylene vinyl acetate (EVA), polyurethane, thermoplastic polyurethane (TPU), thermoplastic polyolefin (TPO), ethylene tetrafluoroethylene (ETFE), polyester, polyethylene terephthalate (PET), polyethylene naphthalate (PEN), polycarbonate, polyethersulfone, polyimide, polyethylene, acrylic, plastic, or the like. While FIG. 9F shows bumps 914 having a dome shape this is not a limitation of the present invention, and in other embodiments bumps 914 may have other shapes, for example cubic, that of a rectangular solid, or the like. While FIG. 9F shows the interior surfaces of bumps 914 not in contact with components 280, this is not a limitation of the present invention, and in other embodiments all or a portion of the inner surface of bumps 914 or film 910 may contact components 280.

Figure 9G:
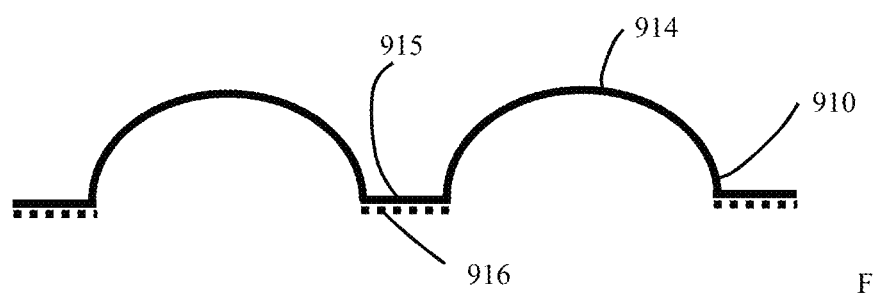
FIG. 9G is a schematic cross-section of a shaped film in accordance with various embodiments of the invention.

In various embodiments of the present invention, regions 914 (containing the shapes or bumps) and/or regions 915 (not containing the shapes or bumps) of film 910 may have additional features. For example, a material 916 may be applied to either the top and/or bottom surface of film 910 in either or both of portions of regions 914 and 915. FIG. 9G shows material 916 applied to the bottom surface of film 910 in regions 915. In various embodiments, material 916 may include, consist essentially of, or consist of an adhesive, for example a material used to adhere film 910 to the underlying substrate such as an epoxy, glue, or other bonding agent. In various embodiments of the present invention, material 916 may include, consist essentially of, or consist of an ink, for example a colored ink, to provide the finished product with a specific color or appearance. For example, in various embodiments material 916 may include, consist essentially of, or consist of a white ink. In various embodiments, inks may be applied to the top and/or bottom surface of film 910. In various embodiments, material 916 may be applied to all or portions of the interior and/or outer surface of the shaped regions 914. For example, in various embodiments material 916 may include, consist essentially of, or consist of a diffusing material, for example a diffusing ink, to diffuse the light from light-emitting components 280. In various embodiments of the present invention, material 916 may have holes defined therein at one or more of the positions of components 280, such that material 916 does not cover such components 280.

Figure 9H:
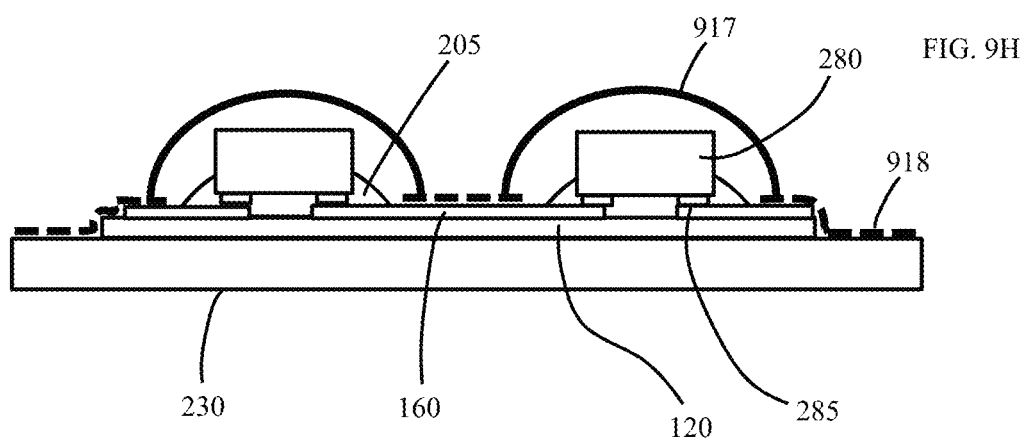
FIG. 9H is a schematic cross-section of an electronic device incorporating a shaped film in accordance with various embodiments of the invention.

In various embodiments, shapes or bumps 914 may be shaped as or may include, consist essentially of, or consist of an optical element, for example a refractive optic, a reflective optic, a total internal reflection optic, a Fresnel optic, or other types of optics. Such optics may be utilized to modify the spatial light distribution pattern of one or more light-emitting components 280, for example to form a collimated beam, to form a wide angle beam, or to form any other spatial light distribution pattern. In various embodiments of the present invention, the optical elements may be coupled into or parts of a continuous material or film, for example as shown in FIG. 9G, or they may be separate optical elements that are positioned over components 280, for example as shown in FIG. 9H. In FIG. 9H, optical elements 917 are attached to the circuit board using material 918, which may be similar to film 910 and in various embodiments may include, consist essentially of, or consist of one or more of the following: ethylene vinyl acetate (EVA), polyurethane, thermoplastic polyurethane (TPU), thermoplastic polyolefin (TPO), ethylene tetrafluoroethylene (ETFE), polyester, polyethylene terephthalate (PET), polyethylene naphthalate (PEN), polycarbonate, polyethersulfone, polyimide, polyethylene, acrylic, plastic, or the like. In various embodiments, material 918 may include, consist essentially of, or consist of an aromatic TPU or an aliphatic TPU. In various embodiments of the present invention, optical elements 917 may be held in place with a local adhesive, that is an adhesive that is disposed only in the region of optical elements 917 and that does not cover all or substantially all of the substrate. While FIG. 9H shows discrete optical elements 917, this is not a limitation of the present invention, and in other embodiments optical elements 917 may be part of a larger element, for example similar to material 910 shown in FIG. 9G.

In various embodiments of the present invention, optical elements 917 or bumps 914 may be separated from components 280, such that they are not optically coupled to component 280. For example, in various embodiments component 280 may include, consist essentially of, or consist of an LEE and optical element 917 or bump 914 may be shaped and disposed over LEE 280 such that optical element 917 or bump 914 is not optically coupled to LEE 280 or to the emission area of LEE 280. However, this is not a limitation of the present invention, and in other embodiments optical element 917 or bump 914 may be coupled to component 280 or to LEE 280 or to the emission area of LEE 280.

In various embodiments of the present invention, the force applied to component 280 may be determined from the pressure within the chamber (or the pressure applied to membrane 210) and the surface area over which the pressure is applied or partially applied, for example the top surface area of component 280 or the area of contact(s) 285. For example, if the desired force on the component is given by about F gm, and the top area of component 280 is about A $cm^2$, then the force per unit area desired on component 280 is approximately F/A $gm/cm^2$. In various embodiments, this force may be achieved on the component by applying a gas or fluid pressure of approximately F/A $gm/cm^2$, e.g., in chamber 250, for example when membrane 210 conforms or substantially conforms to the shape of the component. For example, in one embodiment of the present invention, component 280 is a 3014 SMD LED module, and the desired curing force is about 300 gm. The LED has a length of about 0.3 cm and a width of about 0.14 cm. The top area of the LED is about 0.042 $cm^2$. Thus, the desired pressure on the LED is about 7140 $gm/cm^2$. Converting this to pounds per square (psi) inch gives a value of about 100 psi of gas pressure that may be applied in chamber 250 to achieve the desired force of about 300 gm on the LED. In various embodiments of the present invention, the pressure applied within chamber 250 may be in the range of about 5 psi to about 1000 psi, or in the range of about 15 psi to about 300 psi, or in the range of about 80 to about 200 psi; however, the pressure applied in the chamber is not a limitation of the present invention, and in other embodiments the pressure may have any value. In various embodiments of the present invention, component 280 is a chip-scale package (CSP) LED having two rectangular contacts each about 0.05 cm by about 0.02 cm in size. The total contact area is 2×0.5×0.2 cm², or about 0.002 cm². Assuming the desired curing force is about 5 gm, the pressure is about 5 gm/0.002 cm² or about 2500 gm/cm², or about 36 psi. While the preceding discussion utilizes pressure applied above or to membrane 210, such pressure may also be applied by introducing a negative pressure (e.g., vacuum) under the membrane, for example in region 212, alone or in combination with a pressure above membrane 210.

Figure 10A:
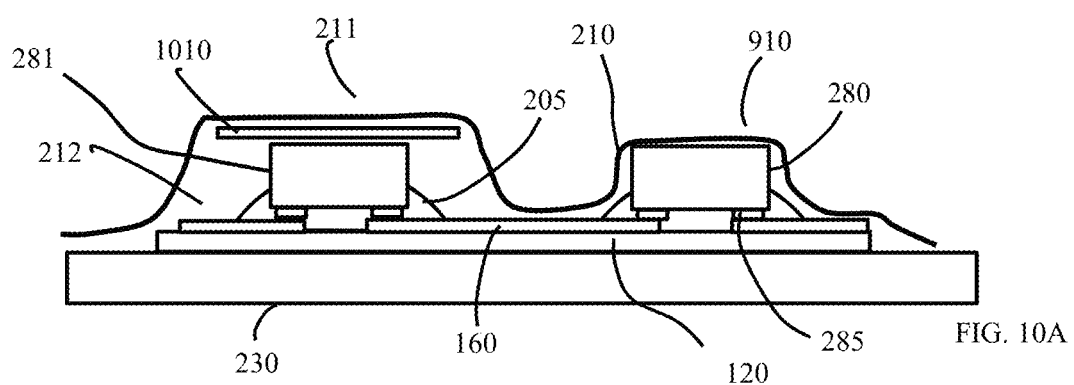
FIG. 10A is a schematic cross-section of a curing system incorporating a force modifier in accordance with various embodiments of the invention.

As discussed herein, in various embodiments of the present invention, for a pliant or conforming membrane 210, the force applied to a component may be determined approximately by multiplying the pressure applied to membrane 210 by the component surface area or top area. In various embodiments of the present invention, the force applied to a component may be increased by modifying the properties of membrane 210 and/or by interposing a force modifier between membrane 210 and the component. In various embodiments of the present invention, the force modifier is rigid and does not deform during the curing process. In various embodiments of the present invention, the force modifier may partially deform during the cure process. FIG. 10A shows a schematic of an adhesive curing apparatus in accordance with embodiments of the present invention that includes a force modifier 1010. In various embodiments of the present invention, force modifier 1010 has a surface area $A_{fm}$ larger than the surface area $A_c$ of an underlying component, in this example component 281. When pressure is applied to membrane 210, the force on component 281 is given approximately by $P \times A_{fm}$, while the force on component 280 is given approximately by $P \times A_c$. Thus, the force applied to component 281 is larger than the force applied to component 280 by approximately the ratio $A_{fm}/A_c$. The use of force modifiers may permit a decoupling of the force applied to a component from the component's surface area or may permit an increase in force applied to one or more components without increasing the pressure on membrane 210 and/or on other components. In various embodiments of the present invention, force modifier 1010 may include, consist essentially of, or consist of plastic, glass, PET, paper, fabric, or the like. In various embodiments, force modifier 1010 may have a Young's modulus in the range of about 0.01 N/m² to about 200 N/m². In various embodiments, the force modifier may be attached to, adhered to, or placed on the component before formation of membrane 210 over the assembly to be cured. In various embodiments of the present invention, one or more force modifiers may be part of membrane 210, for example adhered or attached to membrane 210, or part of membrane 210, and aligned with the desired component or components when membrane 210 is disposed over the assembly to be cured. In various embodiments of the present invention, the force modifier is not part of the final product (and may thus be removed after curing); however, in other embodiments the force modifier may remain on the component.

Figure 10B:
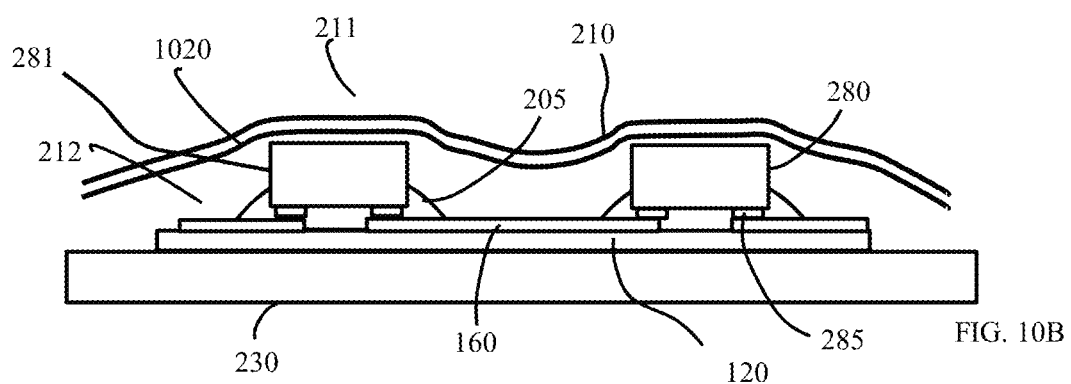
FIG. 10B is a schematic cross-section of a curing system incorporating a force modifier membrane in accordance with various embodiments of the invention.

In various embodiments, a force modifier membrane 1020 having a stiffness larger than that of membrane 210 may be interposed between membrane 210 and the component to provide the same function as force modifier 1010. FIG. 10B is a schematic showing an adhesive curing apparatus in accordance with embodiments of the present invention that includes a force modifier membrane 1020. In various embodiments of the present invention, force modifier membrane 1020 may flex or partially conform to the shape of the components, but because force modifier membrane 1020 does not fully or substantially conform to the shape of the components, the effective area over which the pressure is applied is larger than for the compliant membrane 210 (e.g., as shown in FIG. 2A). In various embodiments of the present invention, membrane 210 may be used in conjunction with force modifier membrane 1020, for example to aid in sealing of region 212; however, in other embodiments, force modifier membrane 1020 may be used without membrane 210. In various embodiments, the properties of membrane 210 may be varied to achieve a force multiplication, for example by using a stiffer material and/or a thicker layer for membrane 210.

In various embodiments, the force modifier 1010 or force modifier membrane 1020 may have a relatively low thermal conductivity, for example to prevent heat dissipation through membrane 210 (e.g., when the heat source is below the assembly to be cured). In various embodiments, the force modifier may have a relatively high thermal conductivity, for example to aid in heat transfer to the component and adhesive (e.g., when the heat source surrounds or is over the assembly to be cured).

In various embodiments, substrate 120 may include, consist essentially of, or consist of a semicrystalline or amorphous material, e.g., polyethylene naphthalate (PEN), polyethylene terephthalate (PET), polycarbonate, polyethersulfone, polyester, polyimide, polyethylene, plastic, glass, metal, fabric, cloth and/or paper. Substrate 120 may have multiple layers, e.g., a deformable layer over a rigid layer, for example, a semicrystalline or amorphous material, e.g., PEN, PET, polycarbonate, polyethersulfone, polyester, polyimide, polyethylene, and/or paper formed over a rigid substrate for example comprising, acrylic, aluminum, steel and the like. Depending upon the desired application for which embodiments of the invention are utilized, substrate 120 may be substantially optically transparent, translucent, or opaque. For example, substrate 120 may exhibit a transmittance or a reflectivity greater than 80% for optical wavelengths ranging between approximately 400 nm and approximately 600 nm. In some embodiments, substrate 120 may exhibit a transmittance or a reflectivity of greater than 80% for one or more wavelengths emitted by an LEE attached thereto. Substrate 120 may also be substantially insulating, and may have an electrical resistivity greater than approximately 100 ohm-cm, greater than approximately $1 \times 10^6$ ohm-cm, or even greater than approximately $1 \times 10^{10}$ ohm-cm. In various embodiments substrate 120 may be flexible, while in other embodiments substrate 120 may be rigid or semi-rigid. The flexibility of substrate 120 is not a limitation of the present invention. In various embodiments, substrate 120 may include, consist essentially of, or consist of fiberglass, FR4, FR2, or a metal core printed circuit board (MCPCB). In various embodiments, the substrate 120 is "flexible" in the sense of being pliant in response to a force such that the substrate may be easily bent or otherwise deformed without damage thereto. The substrate 120 may also be resilient, i.e., tending to elastically resume an original configuration upon removal of the force. In some embodiments, a flexible substrate 120 is configurable to a radius of curvature of about 1 m or less, or about 0.5 m or less, or even about 0.1 m or less. In some embodiments, flexible substrate 120 has a Young's Modulus less than about 100 N/m², less than about 50 N/m², or even less than about 10 N/m². In some embodiments, a flexible substrate 120 has a Shore A hardness value less than about 100; a Shore D hardness less than about 100; and/or a Rockwell hardness less than about 150. The substrate material is not a limitation of the present invention.

In various embodiments, conductive traces 160 may include or consist essentially of silver, gold, aluminum, chromium, copper, and/or carbon, or a conductive ink, which may include one or more elements such as silver, gold, aluminum, chromium, copper, and/or carbon. The conductive trace material is not a limitation of the present invention.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A system for bonding a plurality of electronic components each to an electrically conductive connection point on a substrate via a conductive adhesive, the system comprising:
   an adhesive dispense station for dispensing conductive adhesive to adhere the electronic components to the electrically conductive connection points, the adhesive dispense station comprising a reservoir containing conductive adhesive;
   positioned to receive the electronic components and the substrate after dispensing of the conductive adhesive at the adhesive dispense station, a component placement station for placing the electronic components over the substrate with conductive adhesive between each electronic component and its corresponding connection point; and
   a bonding apparatus comprising:
      a platform for supporting the substrate;
      a reusable membrane for covering at least some of electronic components;
      a source of pressure for urging the membrane against the plurality of electronic components, whereby pressure is applied between each electronic component and its corresponding connection point with conductive adhesive therebetween; and
      a source of energy for at least partially curing the conductive adhesive without laminating or adhering any portion of the membrane to the substrate or to the electronic components, the source of energy comprising an array of individually addressable heating elements within the platform.

2. The system of claim 1, further comprising:
   a test station for electronically and/or optically testing at least some of the electronic components after removal of the membrane therefrom.

3. The system of claim 2, wherein:
   the conductive adhesive comprises an anisotropic conductive adhesive.

4. The system of claim 2, wherein:
   the conductive adhesive comprises an isotropic conductive adhesive.

5. The system of claim 1, wherein the source of pressure comprises a vacuum pump for inducing a negative pressure between the membrane and the substrate.

6. The system of claim 5, wherein the vacuum pump is fluidly connected to a volume between the membrane and the substrate via an opening defined in the membrane.

7. The system of claim 1, further comprising a control system configured to activate only heating elements disposed under portions of the substrate over which the electronic components are disposed.

8. The system of claim 7, wherein the control system is configured to activate the heating elements based on a representation of positions of the electronic components over the substrate.

9. The system of claim 1, wherein the source of pressure comprises a source of fluid pressure.

10. The system of claim 1, wherein the membrane comprises a flexible membrane.

11. The system of claim 1, wherein the source of pressure comprises a source of liquid or a source of gas.

12. The system of claim 1, further comprising an autoclave chamber for receiving therewithin the substrate, the platform, and the membrane, wherein the autoclave chamber comprises the source of pressure and the source of energy.

13. The system of claim 1, wherein the source of energy further comprises one or more second resistive heating elements that are part of the membrane.

14. The system of claim 1, wherein the source of energy further comprises an ultraviolet light source.

15. The system of claim 1, wherein at least one of the electronic components comprises a light-emitting element.

16. The system of claim 1, wherein at least one of the electronic components comprises a light-emitting diode.

17. The system of claim 1, further comprising:
   a supply roll for supplying at least a portion of the substrate to the adhesive dispense station;
   a take-up roll for receiving the at least a portion of the substrate downstream of the bonding apparatus,
   wherein the component placement station is positioned downstream of the adhesive dispense station and upstream of the bonding apparatus.

18. The system of claim 1, wherein the platform is substantially rigid.

19. The system of claim 1, wherein the membrane is sized and shaped to cover only some of the electronic components on the substrate.

20. The system of claim 1, further comprising a removable rigid force modifier for (i) placement between one of the electronic components and the membrane during pressure application and (ii) preventing conformal contact between the membrane and the one of the electronic components during pressure application, the removable rigid force modifier being configured such that, during pressure application, a first force is applied to the one of the electronic components, the first force being larger than a second force applied to at least one of the other electronic components disposed beneath the membrane.

21. The system of claim 1, wherein a stiffness of the membrane is sufficient to prevent conformal contact between the membrane and underlying electronic components and the substrate.

22. The system of claim 1, further comprising a control system configured to activate selected ones of the heating elements to apply heat to different portions of the substrate at different magnitudes, whereby different ones of the electronic components are heated at different magnitudes.

23. The system of claim 1, further comprising a control system configured to activate different ones of the heating elements at different times during the application of pressure.

24. The system of claim 1, wherein different ones of the heating elements are configured to apply heat at different magnitudes.

25. The system of claim 1, wherein the heating elements are configured to at least partially cure the conductive adhesive via application of heat without application of optical radiation.

\* \* \* \* \*